United States Patent
Ueyanagi et al.

(10) Patent No.: US 7,370,536 B2
(45) Date of Patent: May 13, 2008

(54) PRESSURE SENSOR DEVICE AND PRESSURE SENSOR CELL THEREOF

(75) Inventors: Katsumichi Ueyanagi, Nagano (JP); Shigeru Shinoda, Nagano (JP); Kimihiro Ashino, Nagano (JP); Kazunori Saito, Nagano (JP)

(73) Assignee: Fuji Electric Device Technology Co., Ltd. (JP)

( * ) Notice: Subject to any disclaimer, the term of this patent is extended or adjusted under 35 U.S.C. 154(b) by 0 days.

(21) Appl. No.: 11/372,465

(22) Filed: Mar. 10, 2006

(65) Prior Publication Data

US 2006/0213276 A1 Sep. 28, 2006

Related U.S. Application Data

(63) Continuation-in-part of application No. 10/926,797, filed on Aug. 26, 2004.

(30) Foreign Application Priority Data

Mar. 23, 2005 (JP) ............................. 2005-084295

(51) Int. Cl.
*G01L 9/00* (2006.01)
(52) U.S. Cl. ............................. 73/754; 73/715; 73/723; 73/753
(58) Field of Classification Search .......... 73/700–756; 361/283.1–283.4
See application file for complete search history.

(56) References Cited

U.S. PATENT DOCUMENTS

| 4,314,225 | A | 2/1982 | Tominaga et al. |
|---|---|---|---|
| 5,186,055 | A | 2/1993 | Kovacich et al. |
| 5,421,956 | A | 6/1995 | Koga et al. |
| 5,454,270 | A * | 10/1995 | Brown et al. .................. 73/720 |
| 6,055,865 | A | 5/2000 | Ichihasi |
| 6,176,137 | B1 | 1/2001 | Sasaki et al. |
| 6,389,903 | B1 | 5/2002 | Oba et al. |
| 6,457,368 | B1 * | 10/2002 | Sasaki et al. .................. 73/753 |
| 6,487,911 | B1 | 12/2002 | Frackelton et al. |
| 6,578,426 | B2 * | 6/2003 | Imai et al. ..................... 73/720 |
| 6,584,851 | B2 | 7/2003 | Yamagishi et al. |

(Continued)

FOREIGN PATENT DOCUMENTS

JP        01-150832 A    6/1989

(Continued)

*Primary Examiner*—Anore J. Allen
*Assistant Examiner*—Jermaine Jenkins
(74) *Attorney, Agent, or Firm*—Rossi, Kimms & McDowell, LLP

(57) ABSTRACT

A pressure sensor device includes a pressure sensor cell that includes a sensor chip having a diaphragm with piezo-resistors, an amplifying circuit, and various adjusting circuits, and a base member to which the sensor chip is joined, with the diaphragm facing a through hole of the base member. The base member and a metallic member are joined together with a joining member so that their respective through holes communicate with each other. A protective film or filler covers the joining member between the base member and the metallic pipe member. The metallic pipe member is bonded to a resin case, and a signal terminal of the resin case and the pressure sensor chip are electrically connected together by wire bonding, thus forming a pressure sensor cell. The metallic pipe member protrudes beyond an end face of the resin case to support load.

29 Claims, 28 Drawing Sheets

U.S. PATENT DOCUMENTS

| | | | | |
|---|---|---|---|---|
| 6,619,132 B2 * | 9/2003 | Imai et al. | ............... | 73/753 |
| 6,634,567 B2 * | 10/2003 | Hotta et al. | ............ | 236/92 B |
| 7,143,651 B2 * | 12/2006 | Sasaki et al. | ............. | 73/721 |
| 2004/0200286 A1 | 10/2004 | Mast | | |
| 2005/0087020 A1 | 4/2005 | Ueyanagi et al. | | |

FOREIGN PATENT DOCUMENTS

| | | |
|---|---|---|
| JP | 2000-55762 A | 2/2000 |
| JP | 2002-168718 A | 6/2002 |
| JP | 2002-202215 A | 7/2002 |
| JP | 2004-184355 A | 7/2004 |

* cited by examiner

PRESSURE SENSOR DEVICE AND PRESSURE SENSOR CELL THEREOF

This is a continuation-in-part of U.S. patent application Ser. No. 10/926,797 filed on 26 Aug. 2004, the entire disclosure of which is incorporated herein by reference.

BACKGROUND

A pressure sensor device is typically mounted on a block, such as an automobile transmission oil-filled block, a hydraulic actuator block, or the like to measure pressure, and typically uses a semiconductor pressure sensor chip, applying a piezo-resistance effect as a sensor element. Such a semiconductor pressure sensor has an arrangement in which a plurality of semiconductor strain gauges are connected in a bridge circuit on a diaphragm made of a material, such as single crystal silicon, that exhibits a piezo-resistance effect. Deforming the diaphragm, due to a change in pressure, causes the gauge resistance of the semiconductor strain gauges to change in accordance with the amount of deformation. The amount of change is output from the bridge circuit as a voltage signal.

FIGS. 26-29 illustrate some known pressure sensor devices. The pressure sensor device shown in FIG. 26 is provided with a joint 1 having a threaded section, a flange member 3 for screwing the joint 1 into a section on which the device is installed, a pressure sensor 2 that outputs a voltage signal corresponding to the amount of change in the pressure as explained above, a circuit board 4 having mounted thereon a circuit chip for processing the output signal from the pressure sensor 2, wire bonding 5 connecting the pressure sensor 2 and the circuit board 4 together, and terminals 6 and 7 for outputting the signal from the circuit board 4 to the outside. The terminal 6 and a terminal stand 8, which supports the terminal 7, are secured to the flange member 3 by a joining member 11. Moreover, a gasket 9 and an O-ring 10 are assembled onto the joining member 11. See for example FIG. 1 of Japanese Patent Application Laid-open No. 2002-168718.

The pressure sensor device shown in FIG. 27 is composed of a transducer 12, a hexagonal port 13, a cover 14, an annular sealing gasket 15, a periphery clip 16, a flexible circuit 17, and a base member 18 for outputting a signal to the outside. The transducer 12 is composed of a first conductive film that deforms upon being subjected to pressure, a second conductive film facing the first conductive film with a spacer therebetween, and a circuit for converting an electrostatic capacitance that changes through the deformation of the first conductive film into a voltage signal. See for example FIG. 1 of Japanese Patent Application Laid-open No. 2002-202215.

The pressure sensor device shown in FIG. 28 has an arrangement in which, in a sensor case 24 to which are secured connecting leads 19, 20, 21, and 22 that are insulated by hermetically sealing glass 23, a pressure sensor chip 25 is connected to the connecting leads 19, 20, 21, and 22, and the pressure sensor chip 25 is encapsulated in silicone oil by a metallic diaphragm 26. Moreover, the pressure sensor device is protected from above by a metallic hard cover 27. See for example FIGS. 8 and 10 of Japanese Patent Application Laid-open No. 2000-55762.

The pressure sensor device shown in FIG. 29 has an arrangement in which the pressure sensor device shown in FIG. 28 is housed in a metallic housing 28 using an O-ring 29, and a connector housing 33, having therein terminal boards 30, 31, and 32 that are electrically connected to the connecting leads 19, 20, 21, and 22, is crimped onto the metallic housing 28, with an O-ring 34 and a spacer ring 35 for securing thereto. The metallic housing 28 has a pressure receiving port 36, a threaded section 37, a fastening section 38, and a stepped portion 39. See for example FIGS. 8 and 10 of Japanese Patent Application Laid-open No. 2000-55762.

Moreover, it is known, in a semiconductor pressure sensor, to incorporate an amplifying circuit for an output signal from piezo-resistors. The amplifying circuit is formed from a combination of an operational amplifier and a resistance network comprising thin film resistors integrated on a semiconductor element having a diaphragm section on which the piezo-resistors are formed. In a sensor device using such a semiconductor pressure sensor, the semiconductor pressure sensor is housed in a sealed container. In the container, the space on a side faced by a surface of the semiconductor pressure sensor is kept at a constant pressure. Thus, an arrangement is provided such that the pressure applied to the back of the semiconductor pressure sensor is measured via a pressure introducing port in the container, with the pressure in the container being taken as a reference. See for example Japanese Patent Application Laid-open No. 1-150832.

In the pressure sensor devices shown in FIGS. 26 and 27, however, numerous parts raise the material and assembly costs. Moreover, in each of the devices, the signal transmission path is made up of numerous parts that require numerous connections therebetween. Specifically, in the device shown in FIG. 26, the signal transmission path includes the pressure sensor 2, the wire bonding 5, the circuit board 4, the circuit chip, the terminal 6, and the terminal 7. In the device shown in FIG. 27, the signal transmission path includes the transducer 12, the flexible circuit 17, the circuit chip, and the base member 18. This increases the failure probability, causing long-term reliability problems. Furthermore, in the device shown in FIG. 26, the direct joint of the joint 1 and the pressure sensor 2 can cause stress, such as when screwing the joint 1, and transmits to the pressure sensor 2. This lowers the accuracy and reliability of the measured signal.

Moreover, in the pressure sensor device shown in FIG. 28, the silicon oil can become polarized by the external noise applied to the terminals and the outside, which can causes electric charges to accumulate on the surface of the pressure sensor chip 25. This can vary the signal output from the pressure sensor chip 25 and lower the reliability of the measured signal. Moreover, an increase in an inner pressure due to expansion of the silicon oil under a high temperature environment and compression of the silicon oil when applying a high pressure produces repeated stresses in the metallic diaphragm 26. This fatigues the metallic diaphragm 26, which is becomes problematic with the long-term reliability. Moreover, in the pressure sensor device shown in FIG. 29, the large area of the section for receiving pressure results in a large applied load to the device. For supporting such a load, rigidity of the metallic housing 28 must be increased. This increases the cost and size of the device.

Moreover, in the pressure sensor device disclosed in Japanese Patent Application Laid-open No. 1-150832, the external signal terminals for outputting output signals to the outside are glass-sealed at the bottom of the container, and hence the container is assumed to made of metal. The metal container, however, has the disadvantage of being expensive. Furthermore, the external signal terminals and a pressure introducing port are provided on the same side. Therefore, when the pressure sensor device is used for measuring the pressure, while mounted on an oil-filled block, an actuator block or the like, the external signal terminals interrupt the pressure sensor device, making it difficult to mount the pressure sensor device. Therefore, the external signal terminals must be projected on the side opposite to the side on which the pressure introducing port is provided. However, as explained above, when the container is metallic, it is difficult to provide the external terminals on the opposite side of the pressure introducing port.

There still remains a need for a pressure sensor device that can be manufactured with a low cost, have a high long-term reliability, and with measured signals of high accuracy and reliability, and in particular with external terminals disposed on the opposite side of the pressure introducing port. The present invention addresses this need

SUMMARY OF THE INVENTION

The present invention relates to a pressure sensor device and a pressure sensor cell thereof for measuring pressure, and in particular relates to a pressure sensor device that can measure pressures above 1 MPa.

A pressure sensor device includes a pressure sensor cell, which can include a pressure sensor chip, a base member, pressure introducing means, resin case, and a joining member. The pressure sensor chip can have a pressure receiving section for receiving pressure and means for converting strain of the pressure receiving section into an electrical signal. The base member can have a first face, a second face, and a through hole extending through the first and second faces. The pressure introducing means can have a first face, a second face, and a through hole penetrating through the first and second faces. The resin case can have a signal terminal for outputting the electrical signal from the pressure sensor chip. The joining member joins the pressure introducing means and the base member.

The pressure sensor chip can be joined to the second face of the base member with the pressure receiving section facing the through hole of the base member. The joining member joins the second face of the pressure introducing means to the first face of the base member with the through hole of the pressure introducing means communicating with the through hole of the base member. The resin case is bonded to the pressure introducing means. The pressure sensor chip and the signal terminal are electrically connected together by wire bonding.

According to one aspect of the present invention, the cell can further include at least one of a protective member or a filler that covers the joining member. The protective member or the filler is in the through hole of the base member.

According to another aspect of the present invention, the pressure introducing means can protrude beyond an end face of the resin case.

The pressure introducing means can include a protruding portion on the second face thereof, with the protruding portion including a through hole. The pressure introducing means can have a stepped portion protruding outwardly part way along from an end of the pressure introducing means joined to the base member to an open end of the pressure introducing means at which the through hole opens, and the stepped portion can be bonded to the resin case with the stepped portion contacting an end of the resin case on the side of the open end of the pressure introducing means.

The pressure sensor cell can further include a metallic thin film on the first face of the base member, and the joining member comprising a metallic material joins the second face of the pressure introducing means to the first face of the base member. The metallic thin film can comprise three layers of chromium or titanium, platinum, and gold. Alternatively, the joining member comprising an adhesive or a low-melting glass joins the second face of the pressure introducing means to the first face of the base member.

The pressure sensor chip can be electrostatically bonded to the base member or joined together with a low-melting glass. The pressure introducing means can be made of 42 alloy and can be surface-plated with nickel or nickel and gold. Alternatively, the base member and the pressure introducing means can be formed integrally with an insulating material.

The device can further include a connector member and a joint member. The connector member can have a disposing section on which the pressure sensor cell is disposed and an output terminal integrally molded therewith. One end of the output terminal is electrically connected to the signal terminal of the pressure sensor cell and the other end of the output terminal protrudes out externally. The joint member can include a threaded section having a through hole therein and a containing section having a securing section that secures the connector member. The containing section contains the pressure sensor cell disposed on the connector member.

The pressure sensor cell can be disposed on the connector member with an opening in the first face of the pressure introducing means open for communication with a pressure-transmitting medium. The output terminal integrally molded with the connector member can be electrically connected to the signal terminal of the pressure sensor cell. The through hole of the threaded section communicates with the through hole of the pressure introducing means. The space between the pressure introducing means and the joint member can be sealed with sealing means.

DETAILED DESCRIPTION

Figure 1:
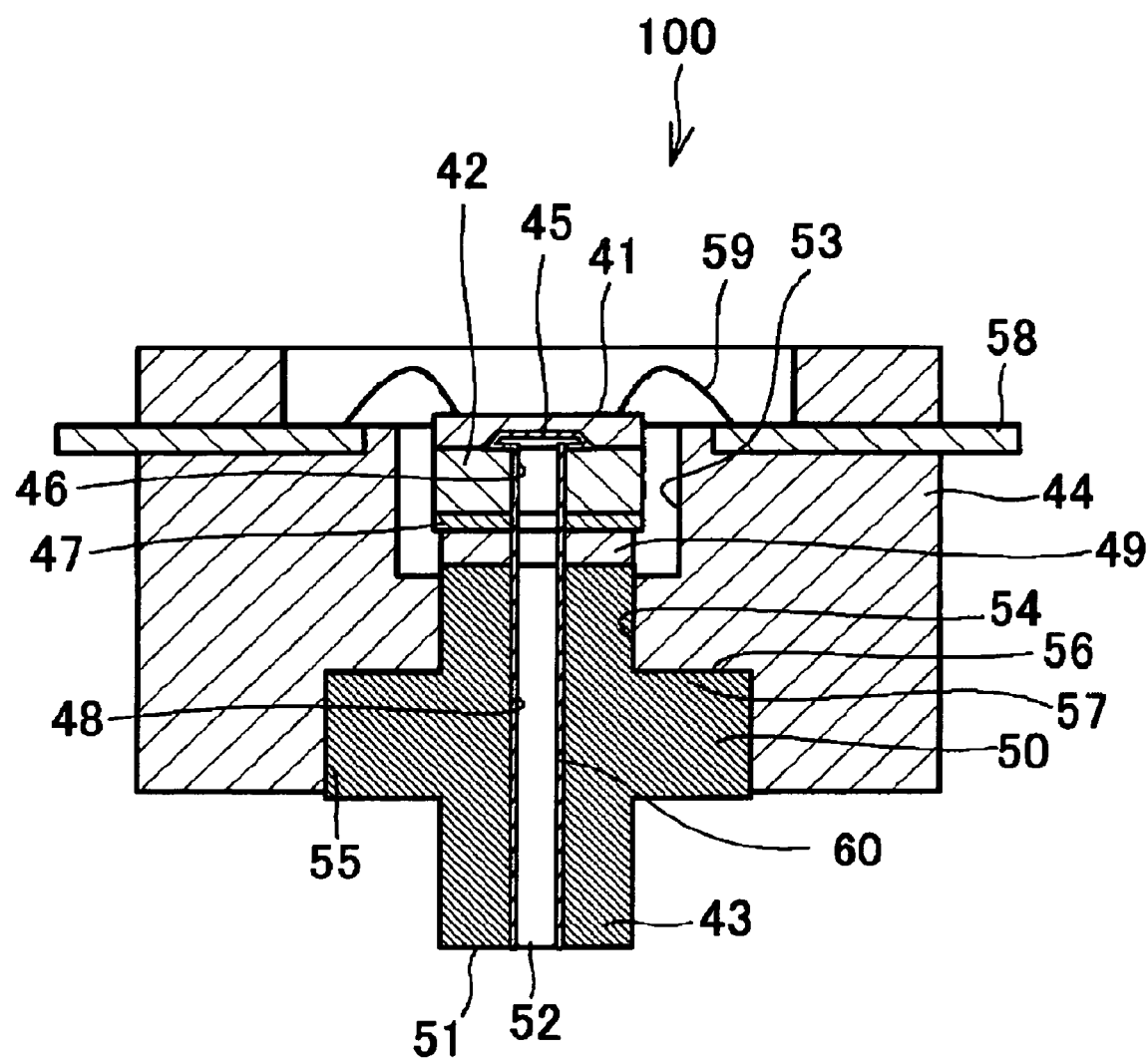
FIG. 1 illustrates a cross section of a first embodiment of a pressure sensor cell according to the present invention.

In the following description of the embodiments, constituent elements that are the same or similar in different embodiments are designated with the same reference numeral.

FIG. 1 is a cross sectional view of a first embodiment of a pressure sensor cell 100 according to the present invention. In this embodiment, the pressure sensor cell 100 includes a pressure sensor chip 41, a base member 42, a pressure introducing unit 43, and a case 44, which can be made of resin. The pressure sensor chip 41 has a diaphragm 45, which is a pressure receiving section for receiving pressure, formed by processing part of a first face (bottom face in the illustration) of semiconductor silicon, for example, by recessing or etching. In the area corresponding to the backside of the diaphragm 45, on a second face (upper face in the illustration) of the silicon semiconductor, at least four gauges (not illustrated) are formed, each of which can be made of a diffused resistor. When pressure is applied to the diaphragm 45, these gauges convert the strain on the second face of the semiconductor silicon to resistance values. The pressure sensor chip 41, however, can be made of semiconductor materials other than silicon.

Moreover, in the pressure sensor chip 41, various circuits are formed, such as a Wheatstone bridge circuit formed with the gauges, a circuit for amplifying the output signal of the Wheatstone bridge circuit, a circuit for correcting or compensating sensitivity, a circuit for correcting or compensating an offset, and a circuit for correcting or compensating temperature characteristics of the sensitivity and the offset. Moreover, in the pressure sensor chip 41, other elements can be formed, such as a surge protecting element and a filter (not illustrated). Alternatively, the above circuits can be formed on a separate semiconductor chip, with the resin case 44 made a little larger so as to accommodate and secure a this chip. Alternatively, circuits having the above functions can be provided outside the pressure sensor device.

The base member 42, though not particularly restricted, can be made of, for example, glass material, namely PYREX glass or TEMPAX glass. A through hole 46 for communicating a pressure-transmitting medium, such as air or oil, can be formed in the center of the base member 42. The base member 42 and the pressure sensor chip 41 can be joined by electrostatic bonding under the joining condition at 400° C. and 400V, with the diaphragm 45 facing the through hole 46. The electrostatic bonding can join the pressure sensor chip 41 and the base member 42 with good integrity and high air-tightness maintained between them. This enables realization of a highly airtight structure. Apart from electrostatic bonding, these components can be joined with low-melting glass.

A metallic thin film 47 is layered on the side of the base member 42 facing the pressure introducing unit 43, which can be formed of a metallic pipe member. The thin film 47 can be composed of three layers, namely a chromium or titanium film, platinum film, and a gold film, in this order from the side of the base member 42. Chromium has an excellent adhesion property to glass material to maintain a good joint with the glass material and prevent the thin film 47 from prematurely separating from the glass material. Moreover, the platinum film isolates the chromium film and the gold film so that they do not come into contact with each other, i.e., prevent migration problem. Furthermore, the gold film is suitable for the joining of the base member 42 and the metallic pipe member 43, with gold/tin eutectic solder or high temperature solder intervening between them.

The metallic pipe member 43, although not particularly restricted, can be made of, for example, 42 alloy, with a plating. The plating can be one of nickel or combination of nickel and gold plating. In the center of the metallic pipe member 43, a through hole 48 is provided for communicating a pressure-transmitting medium, namely fluid such as air or oil therein. The metallic pipe member 43 and the base member 42, with the respective through holes 48 and 46 thereof positioned to communicate with each other, are joined together with a joining member 49, which can be a metallic material such as the gold/tin eutectic solder or the high temperature solder. The reason for plating the metallic pipe member 43 is to increase the joining strength with the base member 42. The reason for using solder such as the gold/tin eutectic solder or the high temperature solder as the metallic material 49 is to enable the pressure sensor cell 100 to withstand service under high temperatures. Another reason is that low Young's modulus of these kinds of solder can reduce stress created in each of the base member 42 and the metallic pipe member 43 due to the difference in coefficient of thermal expansion between them. Here, the coefficients of thermal expansion of chromium, platinum, and gold are $4.5 \times 10^{-6}/°C.$, $9 \times 10^{-6}/°C.$ and $14.3 \times 10^{-6}/°C.$, respectively, whereas, the coefficients of thermal expansion of the glass material of the base member 42 is $3.2 \times 10^{-6}/°C.$ and the coefficient of thermal expansion of the 42 alloy material of the metallic pipe member 43 is $4.3 \times 10^{-6}/°C.$ Alternatively, the joining member 49 can be an adhesive, such as an epoxy adhesive, instead of the metallic material. In this case, the metallic thin film 47 need not be provided on the back of the base member 42, reducing the manufacturing cost. Moreover, the residual stress after the joining can be reduced. Whether to secure the metallic pipe member 43 and the base member 42 together by soldering or by using an adhesive can depend on the pressure-transmitting medium to be measured.

The metallic pipe member 43 can include a stepped portion 50 protruding outwardly from the side thereof, between the one end joined to the base member 42 and the opposite end thereof, namely an open end 51 from which the through hole 48 of the metallic pipe member 43 opens. The opening of the through hole 48 at the open end 51 of the metallic pipe member 43 is referred to as a pressure introducing port 52.

The resin case 44 has a first recess 53 on the side of one end thereof. The pressure sensor chip 41 and the base member 42 are positioned or contained in the first recess 53. In the bottom of the first recess 53, a through hole 54 is provided, which extends through from the bottom to the opposite end of the resin case 44. Part of the metallic pipe member 43 is contained or positioned in the through hole 54. On the end of the resin case 44 opposite to the recess 53, a second recess 55 is formed. The second recess 55 is stepped to complement the stepped portion 50 of the metallic pipe member 43. With the stepped portion 50 being seated in the recess 55, the face 56 of the stepped portion 50 on the opposite side of the pressure introducing port 52 is bonded to the face 57 of the recess 55 contacting the face 56.

With the faces 56 and 57 bonded, when the pressure-transmitting medium introduced from the pressure introducing port 52 applies pressure to the pressure sensor cell 100, the pressure acts on the stepped portion 50 of the metallic pipe member 43 to press the stepped portion 50 against the resin case 44. This provides a high structural reliability under applied pressure. Moreover, the resin case 44 has a signal terminal 58 for outputting a signal to the outside. The base end of the signal terminal 58 is exposed at the side of the recess 53. The exposed portion of the signal terminal 58 and the pressure sensor chip 41 are electrically connected by wire bonding 59.

When the pressure-transmitting medium is oil, such as engine or transmission oil, and when the joining member 49 is an adhesive, such as an epoxy adhesive, then the adhesive strength can drop if the oil penetrates into the adhesive. To prevent oil penetration, the surface of the adhesive between the base member 42 and the metallic pipe member 43 can be coated with a fluorinated protective film 60. Oil resistance thus can be ensured with the protective film 60.

In the pressure sensor cell 100 according to this embodiment, the pressure-transmitting medium is introduced from the pressure introducing port 52. The pressure received by the diaphragm 45 of the pressure sensor chip 41 deforms the diaphragm 45, which changes the resistance values of the gauges on the diaphragm 45 and outputs a voltage signal corresponding to the strain applied to the gauges. The voltage signal is amplified by an amplifying circuit, adjusted by adjusting circuits, such as the sensitivity compensating or correcting circuit, the offset compensating or correcting circuit, and the temperature characteristics compensating or correcting circuit, and thereafter output from the pressure sensor chip 41. The output signal is then output to the signal terminal 58 through the wire bonding 59.

Here, the pressure-transmitting medium only contacts the inner wall of the metallic pipe member 43, the inner wall of the base member 42, and the diaphragm 45 of the pressure sensor chip 41. Therefore, the pressure-transmitting medium, whether in gaseous form of an air conditioning medium, such as R134a gas or $CO_2$ gas, or in liquid form, such as oil or lubricant, will not degrade the pressure sensor cell 100. This enables the pressure sensor cell 100 to obtain a high reliability for a long time. Moreover, even when a high pressure is measured, an area for receiving the pressure is limited only to the area of the diaphragm 45. Therefore, it becomes possible to reduce the size and weight of the pressure sensor device using the pressure sensor cell 100, as well as reducing manufacturing cost.

Specifically, if the pressure to be measured and the diameter of the diaphragm 45 are taken as 20 MPa and 1 mm, respectively, for example, the pressure receiving area will be 0.78 mm$^2$, from which the load received by the pressure sensor cell 100 is calculated as 20 MPa×0.78 mm$^2$. Letting the area of the face 57 of the recess 55 in the resin case 44, namely the face 57 (hereinafter a bottom face support) against which the stepped portion 50 of the metallic pipe member 43 is pressed against by the pressure, be 14.9 mm$^2$, the compressive force created at the bottom face support of the resin case 44 is calculated as 20 MPa×0.78 mm$^2$/14.9 mm$^2$, which is 1.05 MPa.

As resin material generally used for such purpose, namely for the resin case 44, can be epoxy resin, polyphenylene sulfide (PPS) resin, polybutylene terephthalate (PBT) resin, or nylon resin. The breaking stresses of such kinds of resin are at levels of 98 to 196 MPa. Therefore, even with the compressive stress of the order of 1.05 MPa created at the bottom face support of the resin case 44, sufficient integrity is assured. This enables the pressure sensor cell 100 to obtain a high reliability for a long time.

The number of connections in a signal transmission path until a signal is output outside can be kept to a minimum to significantly lower the failure probability. Moreover, silicon can be also used for the material of the base member 42. In this case, the pressure sensor chip 41 and the base member 42 can be joined with a sealing glass. This way, the thermal stress created in the pressure sensor chip 41 due to the difference in coefficient of thermal expansion between the pressure sensor chip 41 and the metallic pipe member 43 can be reduced by the presence of the base member 42. Note that silicon also can be used as the material of the base member 42. In this case, the pressure sensor chip 41 and the base member 42 can be joined together using low-melting glass. As a result, thermal stress received by the pressure sensor chip 41 from the metallic pipe member 43 can be absorbed by the base member 42, reducing the thermal stress from the metallic pipe member 43.

Figure 2:
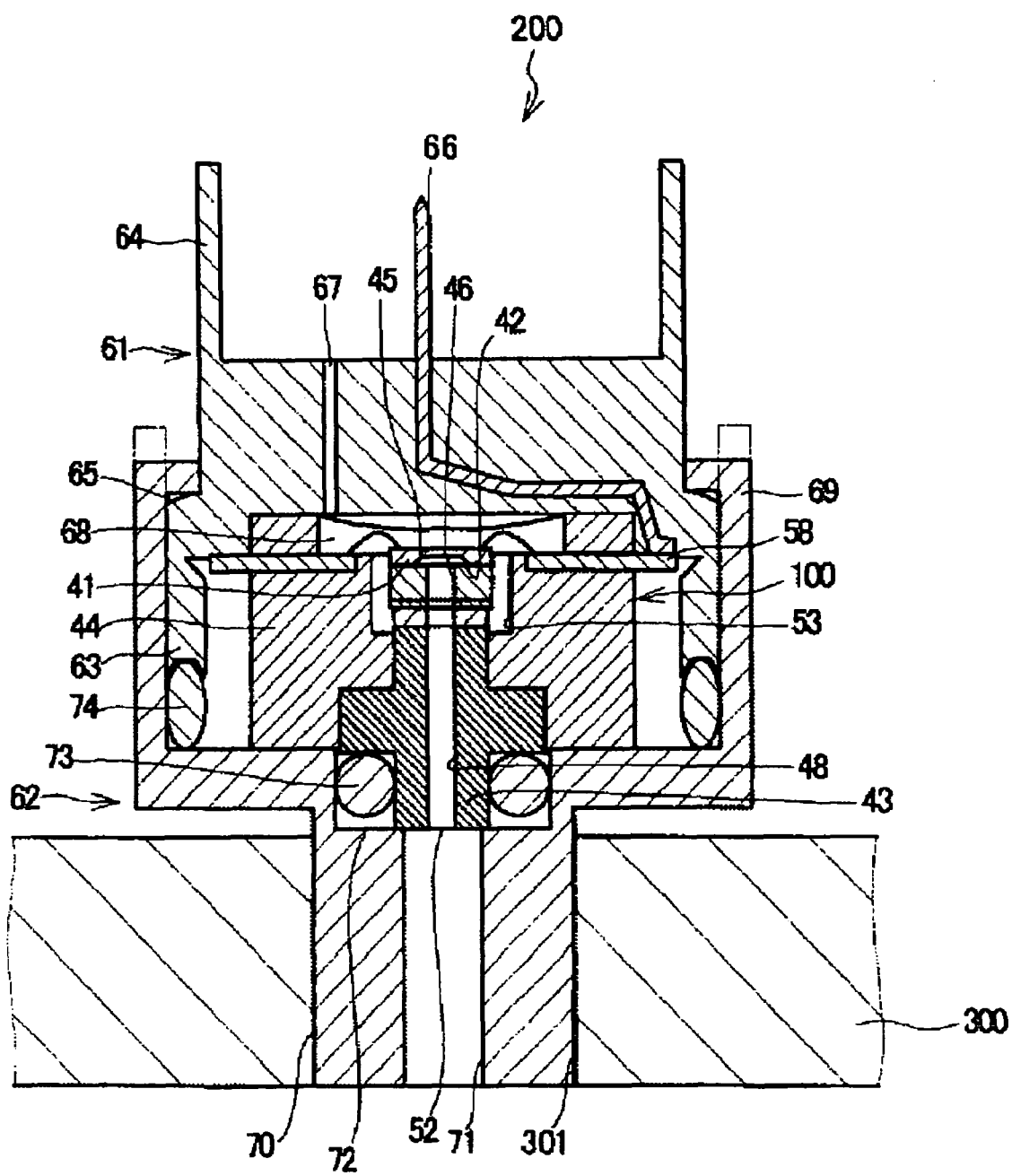
FIG. 2 illustrates a cross section of a first embodiment of a pressure sensor device, which incorporates the pressure sensor cell of FIG. 1, according to the present invention.

FIG. 2 is a cross sectional view showing a first embodiment of a pressure sensor device 200 according to the present invention. The pressure sensor device 200 incorporates the pressure sensor cell 100 of FIG. 1, and is mountable to an enclosure 300 with a mounting means. The mounting means can include a connector member 61 and a joint member 62. The end of the joint member 62 is then bent or crimped over around the side of the connector member 61 to engage the connector member 61 and integrate the pressure sensor cell 100, the connector member 61, and the joint member 62. Note that the protective film 60, which is not illustrated here, can be included to protect the joining member 49.

The connector member 61 can include a housing section 63 for containing the pressure sensor cell 100 and a socket section 64 for connecting the output of the pressure sensor device 200 to the outside. The housing section 63 and the socket section 64 can be integrally molded together. The socket section 64 has an outer diameter or section (if not made circular) smaller than that of the housing section 63 so that a stepped portion 65 is formed between the housing section 63 and the socket section 64. A signal output terminal 66 leading to the outside can be embedded in the connector member 61, between the housing section 63 and the socket section 64. One end of the output terminal 66 is exposed in the housing section 63 and the other end thereof is exposed in the socket section 64 for external connection.

The connector member 61 can have a partition between the housing section 63 and the socket section 64. An end face of the pressure sensor cell 100, on the opposite side of the open end 51, is bonded to an end face (a disposing section) of the partition exposed in the housing section 63. Bonding can be carried out by with an adhesive, such as a silicon or epoxy adhesive to integrate together the connector member 61 and the pressure sensor cell 100. With the pressure sensor cell 100 thus bonded to the connector member 61, reliability of the device under action of mechanical force, such as vibration or shock, can be further increased. Moreover, the root of the output terminal 66 exposed in the housing section 63 can be electrically connected to the signal terminal 58 of the pressure sensor cell 100 by laser welding.

In the partition between the housing section 63 and the socket section 64, a through hole 67 is provided. The through hole 67 is provided for communicating the space in the recess 53 containing the pressure sensor chip 41 in the resin case 44 of the pressure sensor cell 100, with the ambient. Without the through hole 67, gas trapped in the recess 53, when the pressure sensor cell 100 is mounted on the connector member 61, contracts and expands with the change in temperature or ambient pressure to affect the pressure reading. The presence of the through hole 67 thus allows any built up gas in the recess 53 to freely enter and exit the recess 53. Therefore, even though the gas in the recess 53 contracts or expands with the change in temperature and ambient pressure, the characteristics of the pressure sensor is not varied. Moreover, in the example shown in FIG. 2, the recess 53 containing the pressure sensor chip 41 can be filled with gel 68. Although the gel 68 is not necessary, it is effective in protecting the pressure sensor chip 41.

The joint member 62 has an arrangement in which a containing section 69 and a threaded section 70 are integrated. The containing section 69 has a securing section (not numbered) for securing the housing section 63 of the connector member 61 and contains the pressure sensor cell 100. The threaded section 70 protrudes outwardly from the bottom of the containing section 69. In the center of the threaded section 70, a through hole 71 is provided for communicating a pressure-transmitting medium, such as air or oil therein. The containing section 69 of the joint member 62 is placed over the housing section 63 of the connector member 61 in which the pressure sensor cell 100 is bonded. An end rim, i.e., the securing section, of the containing section 69 is then bent over or crimped along the stepped portion 65 around the connector member 61 by means of a tool or a machine to engage the stepped portion 65. This secures the joint member 62 and the connector member 61 together. Securing can be carried out by a method other than engagement by bending or crimping, such as bonding. With the joint member 62 and the connector member 61 thus secured to each other, an arrangement is provided such that the pressure introducing port 52 of the pressure sensor cell 100 communicates with the through hole 71 in the threaded section 70.

Furthermore, as shown in FIG. 2, the pressure sensor device 200 is mountable to the enclosure 300 enclosing the pressure-transmitting medium by screwing the threaded section 70 into a threaded hole 301 formed through the enclosure 300. With the pressure sensor device 200 mounted to the enclosure 300, the through hole 71 of the threaded section 70 communicates with the space in the enclosure 300 in which the pressure-transmitting medium is enclosed. Therefore, the pressure-transmitting medium can be introduced to the diaphragm 45 of the pressure sensor chip 41 through the through hole 71 in the threaded section 70 and the respective through holes 48 and 46 of the metallic pipe member 43 and the base member 42 in the pressure sensor cell 100. The enclosure 300 can be, for example, an oil containing block of a transmission or an oil block of a hydraulic actuator.

At the bottom of the containing section 69, a recess 72 is formed. The recess 72 accommodates the end of the metallic pipe member 43 on the side of the pressure introducing port 52, as well as an O-ring 73, which is a sealing measure, for sealing the space between the metallic pipe member 43 and the joint member 62. The O-ring 73, in the recess 72 of the containing section 69, seals the space between at least the side face of the recess 72 and the side face of the metallic pipe member 43. The O-ring 73 prevents the pressure-transmitting medium, introduced to the metallic pipe member 43 through the through hole 71 in the threaded section 70, from flowing into sections other than the through hole 48 in the metallic pipe member 43. The space between the metallic pipe member 43 and the joint member 62 can be sealed with other sealing measures or means, such as projection welding or laser welding.

Moreover, also in the space between the housing section 63 in the connector member 61 and the containing section 69 of the joint member 62, an O-ring 74 sealing the space is provided. The O-ring 74 prevents the pressure-transmitting medium from leaking out if there is a failure, such as leakage of the pressure-transmitting medium from the metallic pipe member 43, breakage of the pressure sensor chip 41, and separation of the joined interface of the pressure sensor chip 41 and the base member 42.

Due to the arrangement being simple as described above, the part cost and the assembly cost can be kept low. Moreover, when the pressure sensor device 200 is screwed on the enclosure 300, the stress created in the threaded section 70 is applied to the pressure sensor chip 41 through the O-ring 73. Therefore, the applied stress is lessened by the O-ring 73 to make it possible to enhance accuracy and reliability of the measured signal. In addition, the output terminal 66 for outputting the signal to the outside is disposed on the opposite side to the opening for introducing the pressure-transmitting medium.

Figure 3:
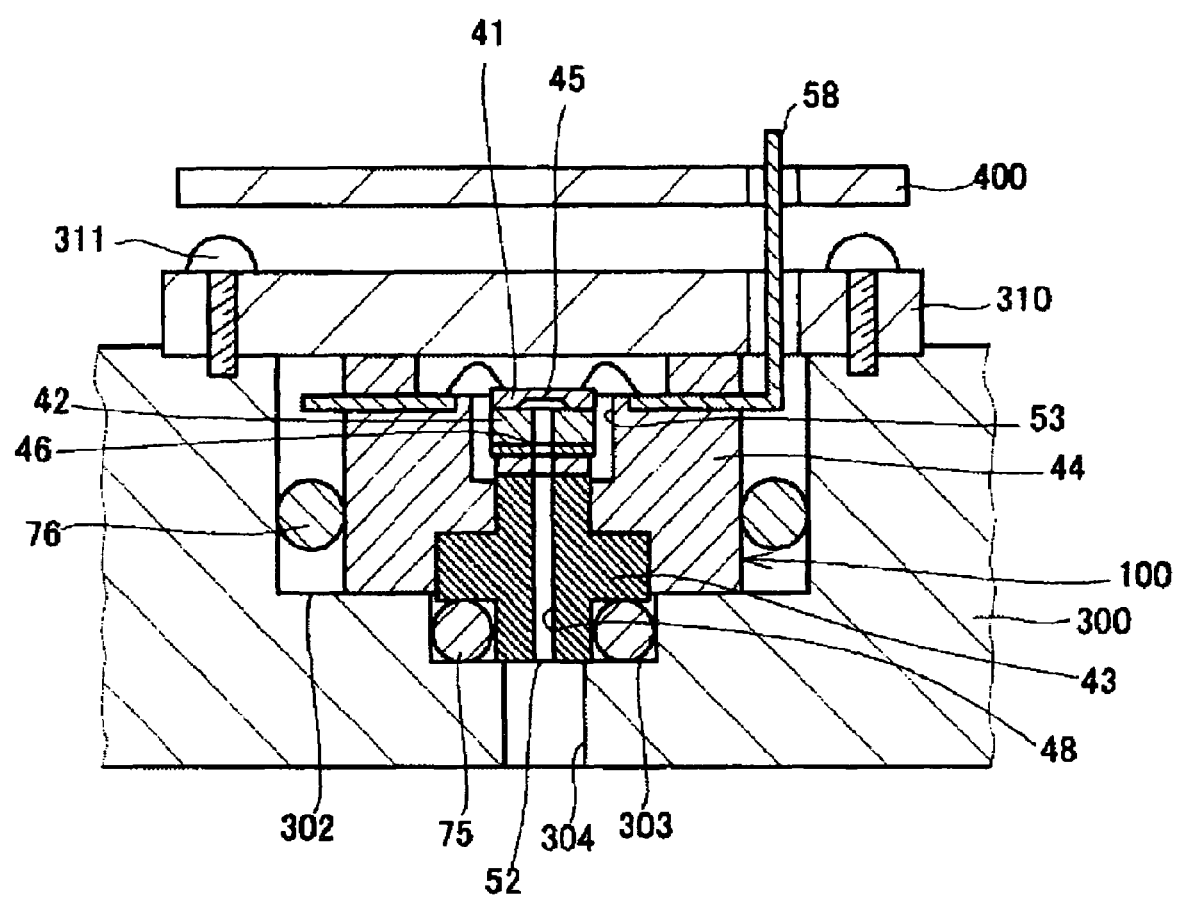
FIG. 3 illustrates a cross section of a second embodiment of a pressure sensor device, which incorporates the pressure sensor cell of FIG. 1, according to the present invention.

FIG. 3 is a cross sectional view showing a second embodiment of a pressure sensor device according to the present invention. The pressure sensor device includes the pressure sensor cell 100 mounted to the enclosure 300 with a mounting means, which includes a fixture 310 and fasteners 311, such as screws. Namely, in the enclosure 300, a first stepped recess 302 is provided for containing the pressure sensor cell 100. Moreover, the fixture 310 is set over the enclosure 300 and the pressure sensor cell 100 and secured to the enclosure 300 with the screws 311. The pressure sensor cell 100 is secured to the fixture 310 by the pressure applied to the pressure sensor cell 100 from the pressure introducing port 52 and reaction force applied from the fixture 310 against the pressure. Again, the protective film 60, which is not illustrated here, can be included to protect the joining member 49.

A second recess 303 is formed at the bottom of the recess 302. The second stepped recess 303 accommodates the end portion of the metallic pipe member 43, on the side of the pressure introducing port 52 of the metallic pipe member 43. Moreover, a through hole 304 through which the pressure-transmitting medium, such as air or oil, passes is provided at the bottom of the second recess 303. The through hole 304 communicates with the through hole 48 of the metallic pipe member 43. Thus, the pressure-transmitting medium is introduced to the diaphragm 45 of the pressure sensor chip 41 through the through hole 304 in the enclosure 300, and the respective through holes 48 and 46 in the metallic pipe member 43 and the base member 42 in the pressure sensor cell 100.

Moreover, the second recess 303 also accommodates an O-ring 75 that seals the space between the metallic pipe member 43 and the casing 300. The O-ring 75, in the second stepped recess 303, seals the space between at least the side face of the second stepped recess 303 and the side face of the metallic pipe member 43. The O-ring 75 prevents the pressure-transmitting medium, introduced to the metallic pipe member 43 through the through hole 304 in the enclosure 300, from flowing into sections other than the through hole 48 in the metallic pipe member 43. Moreover, the first stepped recess 302 also accommodates an O-ring 76, which seals the space between the resin case 44 of the pressure sensor cell 100 and the enclosure 300. The O-ring 76 prevents the pressure-transmitting medium from leaking out if there is a failure, such as leakage of the pressure-transmitting medium from the metallic pipe member 43, breakage of the pressure sensor chip 41, and separation of the joined interface of the pressure sensor chip 41 and the base member 42.

In the embodiment of FIG. 3, the signal terminal 58 of the pressure sensor cell 100 is bent and channeled to directly connect to a printed circuit board 400 positioned near the enclosure 300, by connection measures, such as soldering or the like. The fixture 310 fully closes the first stepped recess 302 in the enclosure 300, but a through hole (not shown, as in the previous embodiment) is provided in the fixture 310 to communicate the space in the recess 53 containing the pressure sensor chip 41 in the resin case 44 of the pressure sensor cell 100 with the ambient. Alternatively, the fixture 310 can be configured to not fully close the recess 53 in the resin case 44, but to make part of the recess 53 open to the ambient. Furthermore, the recess 53 can be filled with gel.

Figure 4:
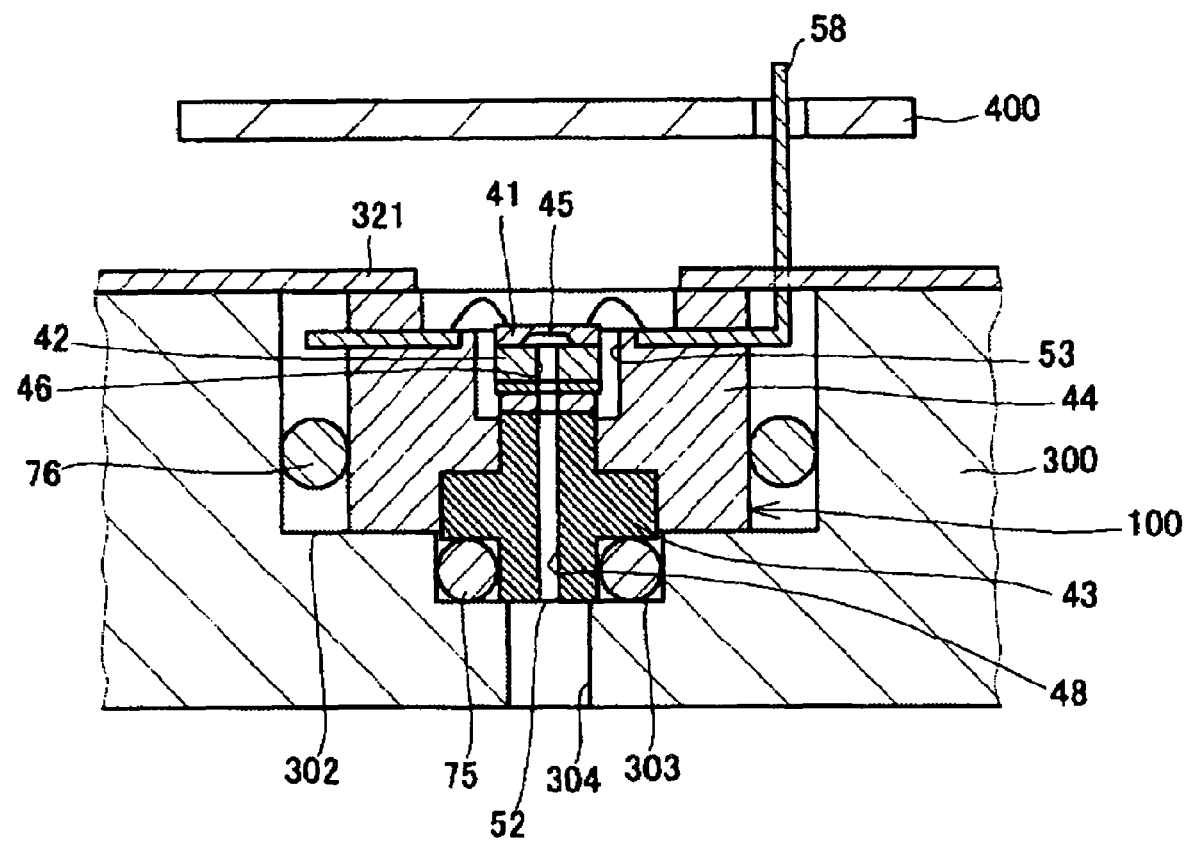
FIG. 4 illustrates a cross section of a third embodiment of a pressure sensor device, which incorporates the pressure sensor cell of FIG. 1, according to the present invention.

FIG. 4 is a cross sectional view of a third embodiment of a pressure sensor device according to the present invention. The embodiment of FIG. 4 is substantially similar to the embodiment of FIG. 3. In the embodiment of FIG. 4, however, instead of securing the pressure sensor cell 100 with the fixture 310 and the fasteners 311 as in the embodiment of FIG. 3, the pressure sensor cell 100, which is contained in the first and second stepped recesses 302 and 303 in the enclosure 300, is secured with a different mounting means. Here, the mounting means includes a tab 321, which stands or extends upwardly from the enclosure 300, bent or crimped over the pressure sensor cell with a machine or a tool, to engage the tab 321 against the resin case 44. Therefore, in the embodiment of FIG. 4, the fixture and fasteners, 310, 311 are eliminated to reduce the number of parts. Also, in this embodiment, like in the embodiment of FIG. 3, the O-ring 75 in the second stepped recess 303 in the enclosure 300 seals the space between at least the side face of the second stepped recess 303 and the side face of the metallic pipe member 43. The other arrangements are the same as those of the embodiment of FIG. 3. Again, the protective film 60, which is not illustrated here, can be included to protect the joining member 49.

Figure 5:
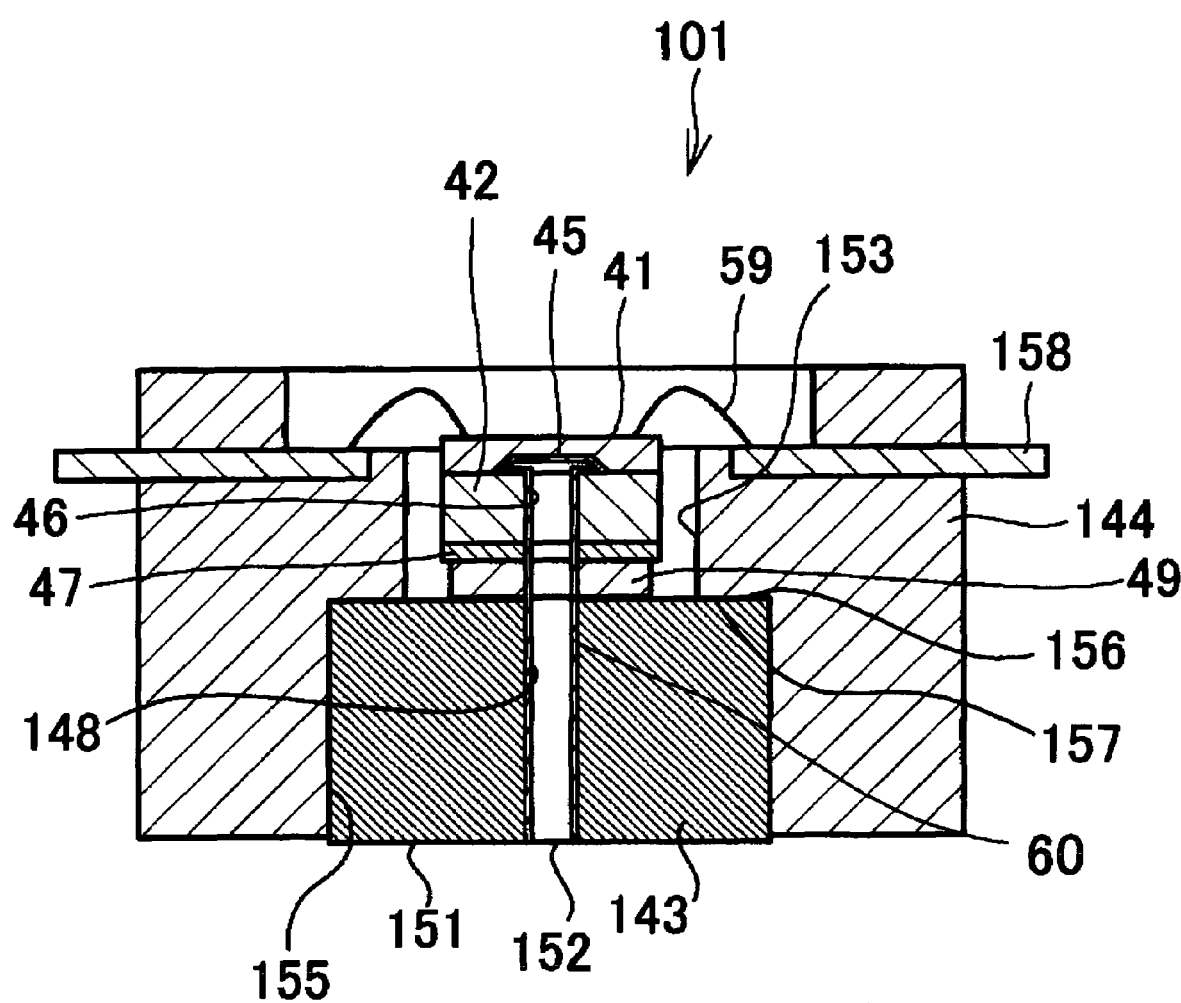
FIG. 5 illustrates a cross section of a second embodiment of a pressure sensor cell according to the present invention.

FIG. 5 is a cross sectional view showing a second embodiment of a pressure sensor cell according to the present invention. Here, the pressure sensor cell 101 is provided with a pressure sensor chip 41, a base member 42, a metallic plate member 143, and a resin case 144. The arrangement of the pressure sensor chip 41 and the base member 42 is the same as that of the embodiment of FIG. 1.

A metallic thin film 47 layered on the side of the base member 42 facing the metallic pipe member 143 can be composed of three layers, namely a chromium or titanium film, a platinum film, and a gold film, in this order from the side of the base member 42. Chromium has an excellent adhesion property to glass material to maintain a good joint with the glass material and prevent the thin film 47 from prematurely separating from the glass material. Moreover, the platinum film isolates the chromium film and the gold film so that they do not come into contact with each other, i.e., prevent migration problem. Furthermore, the gold film is suitable for the joining of the base member 42 and the metallic pipe member 143, with gold/tin eutectic solder or high temperature solder intervening between them.

The metallic plate member 143, though not particularly restricted, can be made of, for example, 42 alloy with a plating, which can be a nickel plating or a combination of nickel and gold plating. In the center of the metallic plate member 143, a through hole 148 is provided for communicating a pressure-transmitting medium, such as air or oil therein. The metallic plate member 143 and the base member 42 are joined together with a joining member 49, which can be a metallic material such as the gold/tin eutectic solder or the high temperature solder, with the through hole 46 of the base member 42 and the through hole 148 of the metallic plate member 143 aligned to communicate with each other. The reason for plating the metallic plate member 143 is to increase the joining strength with the base member 42, as previously discussed with the first embodiment. Alternatively, the joining member 49 can be an adhesive, such as epoxy adhesive, instead of the metallic material, as explained in the embodiment of FIG. 1.

The resin case 144 has a first recess 153 on the side of one end thereof. The pressure sensor chip 41 and the base member 42 are positioned or contained in the first recess 153. On the opposite end of the resin case 144, opposite to the first recess 153, a second recess 155 having an opening area larger than that of the first recess 153 and communicating with the first recess 153 is formed. The first recess 153 and the second recess 155 form a through hole section that extends through the resin case 144. The second recess 155 seats or contains the metallic plate member 143. An opening section of the through hole 148 at an open end 151 of the metallic plate member 143 is referred to as a pressure introducing port 152. A face 156 on the opposite side of the pressure introducing port 152 is bonded to a bottom face 157 (uppermost portion of the metallic plate member 143 in the illustration) of the second recess 155 facing and contacting the face 156.

With the faces 156 and 157 bonded, when the pressure-transmitting medium introduced from the pressure introducing port 152 applies pressure to the pressure sensor cell 101, the pressure acts on the metallic plate member 143 and presses the metallic plate member 143 against the resin case 144. This provides a high structural reliability under applied pressure. Moreover, the resin case 144 has a signal terminal 158 for outputting a signal to the outside. The base end of the signal terminal 158 is exposed at the side of the first recess 153. The exposed portion of the signal terminal 158 and the pressure sensor chip 41 are electrically connected by a wire bonding 59.

The pressure-transmitting medium is introduced from the pressure introducing port 152. The pressure received by the diaphragm 45 of the pressure sensor chip 41 deforms the diaphragm 45. This varies resistance values of the gauges on the diaphragm 45, by which a voltage signal corresponding to the variation is produced. The voltage signal is amplified by an amplifying circuit, adjusted by adjusting circuits, such as the sensitivity compensating or correcting circuit, the offset compensating or correcting circuit, and the temperature characteristics compensating or correcting circuit, and output from the pressure sensor chip 41, as previously disclosed. The output signal is then output to the signal terminal 158 through the wire bonding 59.

The pressure-transmitting medium only contacts the inner wall of the metallic plate member 143, the inner wall of the base member 42 and the diaphragm 45 of the pressure sensor chip 41. Therefore, the pressure-transmitting medium, whether in gaseous form, such as an air conditioning medium, or in liquid form, such as oil or lubricant, does not degrade the pressure sensor cell 101. This enables the pressure sensor cell 101 to obtain a high reliability for a long time. Moreover, even when high pressure is measured, the area for receiving the pressure is limited only to the area of the diaphragm 45. Therefore, it becomes possible to reduce the size and weight of the pressure sensor device using the pressure sensor cell 101, as well as reducing the cost.

Specifically, when the measured pressure and the diameter of the diaphragm 45 are 20 MPa and 1 mm, respectively, for example, the pressure receiving area is 0.78 mm$^2$, from which a load received by the pressure sensor cell 101 is calculated as 20 MPa×0.78 mm$^2$. If, for example, the area of the bottom face 157 of the second recess 155 in the resin case 144, namely the bottom face support against which the metallic plate member 143 is pressed against by the pressure, is 14.9 mm$^2$, the compressive force created at the bottom face support of the resin case 144 is calculated as 20 MPa×0.78 mm$^2$/14.9 mm$^2$, namely 1.05 MPa.

Like in the embodiment of FIG. 1, the resin material used for the resin case 144 can be epoxy resin, polyphenylene sulfide (PPS) resin, polybutylene terephthalate (PBT) resin, or nylon resin. The breaking stresses of such kinds of resin are at levels of 98 to 196 MPa. Therefore, even with the compressive stress of the order of 1.05 MPa created at the bottom face support of the resin case 144, sufficient integrity can be assured. This enables the pressure sensor cell 101 to obtain a high reliability for a long time.

In addition, like the embodiment of FIG. 1, the number of connections in the signal transmission path to the outside can be kept to a minimum to significantly lower the failure probability. Moreover, when silicon is used for the material of the base member 42, and the pressure sensor chip 41 and the base member 42 are joined by using a sealing glass, the thermal stress created in the pressure sensor chip 41 due to the difference in coefficient of thermal expansion between the pressure sensor chip 41 and the metallic plate member 143 is reduced by the presence of or absorbed by the base member 42. Thus, it is possible to reduce the thermal stress due to the junction with the metallic plate member 143. In addition, the metallic plate member 143 substituted for the metallic pipe member 43 of the embodiment of FIG. 1 can further reduce the material cost.

Figure 6:
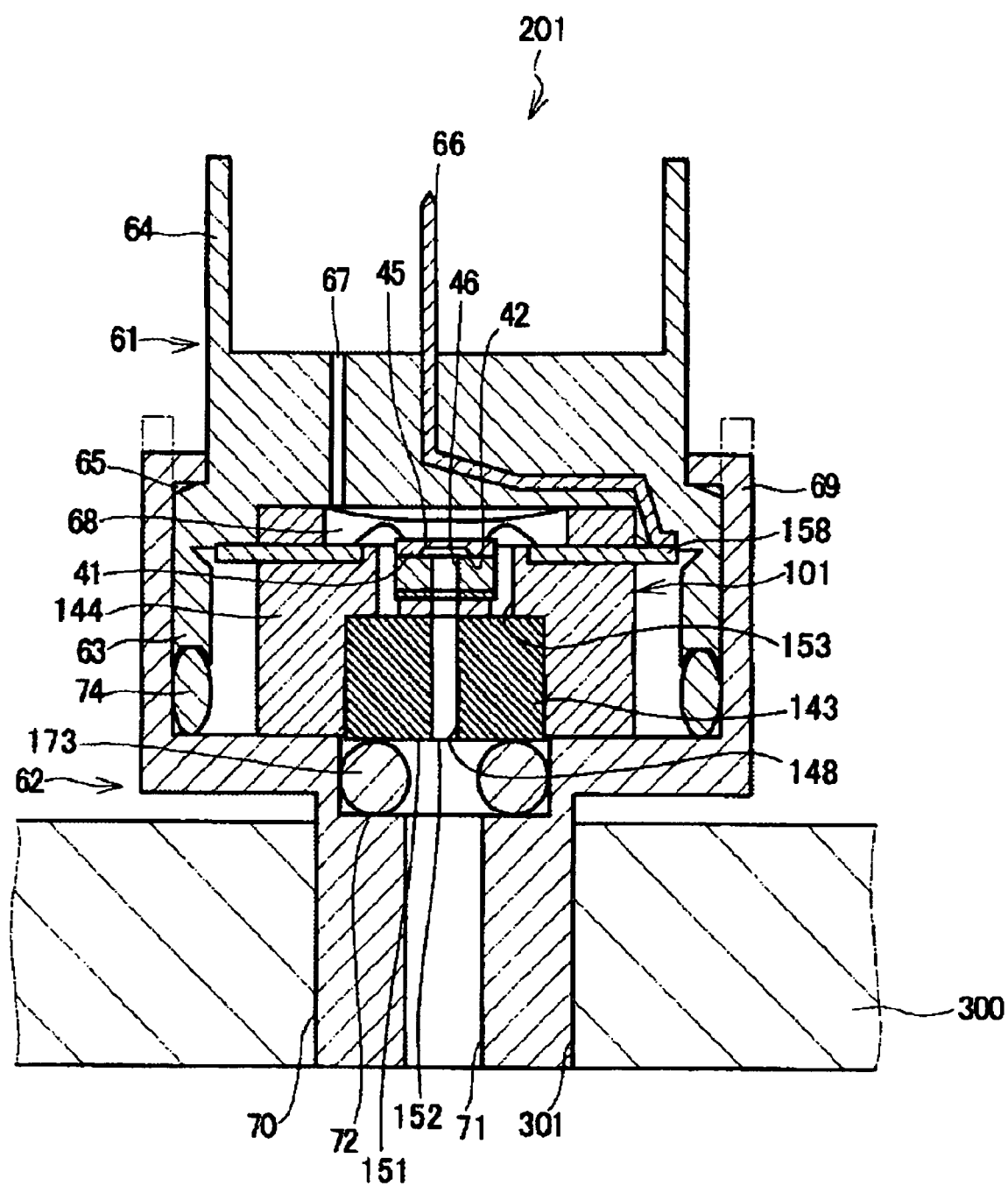
FIG. 6 illustrates a cross section of a fourth embodiment of a pressure sensor device, which incorporates the pressure sensor cell of FIG. 5, according to the present invention.

FIG. 6 is a cross sectional view showing a fourth embodiment of a pressure sensor device according to the present invention. Here, the pressure sensor device 201, is similar to the embodiment of FIG. 2, but includes the pressure sensor cell 101 of FIG. 5 held between the connector member 61 and the joint member 62. An end of the joint member 62 is then bent or crimped over around the connector member 61 to engage the same to thereby integrate the pressure sensor cell 101, the connector member 61, and the joint member 62. The arrangement of the connector member 61 and the joint member 62 is otherwise the same as that of the embodiment of FIG. 2. Again, the protective film 60, which is not illustrated here, can be included to protect the joining member 49.

The end face of the pressure sensor cell 101 on the opposite side of the open end 151, where the pressure introducing port 152 is opened, can be bonded to the end face (a disposing section) of a partition between the housing section 63 and the socket section 64 in the connector member 61, which face is exposed in the housing section 63. The bonding can be carried out with an adhesive, such as a silicon or epoxy adhesive or the like. Thus, the connector member 61 and the pressure sensor cell 101 can be integrated together. With the pressure sensor cell 101 bonded to the connector member 61, reliability of the device under action of mechanical force, such as vibration or shock, can be further increased. Moreover, the root of the output terminal 66 exposed in the housing section 63 can be electrically connected to the signal terminal 158 of the pressure sensor cell 101 by laser welding.

Moreover, in the embodiment of FIG. 6, the recess 153 containing the pressure sensor chip 41 can be filled with gel 68. Although the gel 68 is not essential, it is effective in protecting the pressure sensor chip 41. Accordingly, the recess 153 is preferably filled with the gel 68. In the pressure sensor device 201, a pressure-transmitting medium enclosed in the space in the enclosure 300 is introduced to the diaphragm 45 of the pressure sensor chip 41 through the through hole 71 in the threaded section 70 of the joint member 62 and the respective through holes 148 and 46 of the metallic plate member 143 and the base member 42 in the pressure sensor cell 101.

The recess 72 formed in the bottom of a containing section 69 of the joint member 62 accommodates an O-ring 173, which is a sealing measure for sealing a space between the metallic plate member 143 and the joint member 62. The O-ring 173, in the recess 72 of the containing section 69, seals the space between at least the bottom face of the recess 72 and the open end 151 of the metallic plate member 143. The O-ring 73 prevents the pressure-transmitting medium, introduced to the metallic plate member 143 through the through hole 71 in the threaded section 70, from flowing into sections other than the through hole 148 in the metallic plate member 143.

A simple arrangement according to the embodiment of FIG. 6 can reduce the material cost and the assembly cost. Moreover, when the pressure sensor device 201 is mounted (screwed in) to the enclosure 300, the stress created in the threaded section 70 is applied to the pressure sensor chip 41 through the O-ring 173. Therefore, the O-ring 173 can lessen the applied stress to the pressure sensor chip to enhance accuracy and reliability of the measured signal. In addition, the output terminal 66 for outputting a signal to the outside is disposed on the opposite side of the opening for introducing the pressure-transmitting medium.

Furthermore, in the embodiment of FIG. 6, the load acting on the pressure sensor cell 101 by the pressure-transmitting medium is determined by a first area defined by a line of contact between the open end 151 of the metallic plate member 143 and the O-ring 173. In comparison, in the embodiment of FIG. 2, the load acting on the pressure sensor cell 100 by the pressure-transmitting medium is determined by a second area, which is larger than the first area, defined by a line of contact between the side face of the recess 72 in the joint member 62 and the O-ring 73. Since the first area is smaller than the second area, the load acting on the pressure sensor cell 101 becomes smaller than the load in the embodiment of FIG. 2. Therefore, the pressure sensor device 201 of the embodiment of FIG. 6 is suitable for measuring higher pressure than the pressure sensor device 200 of the embodiment of FIG. 2.

Figure 7:
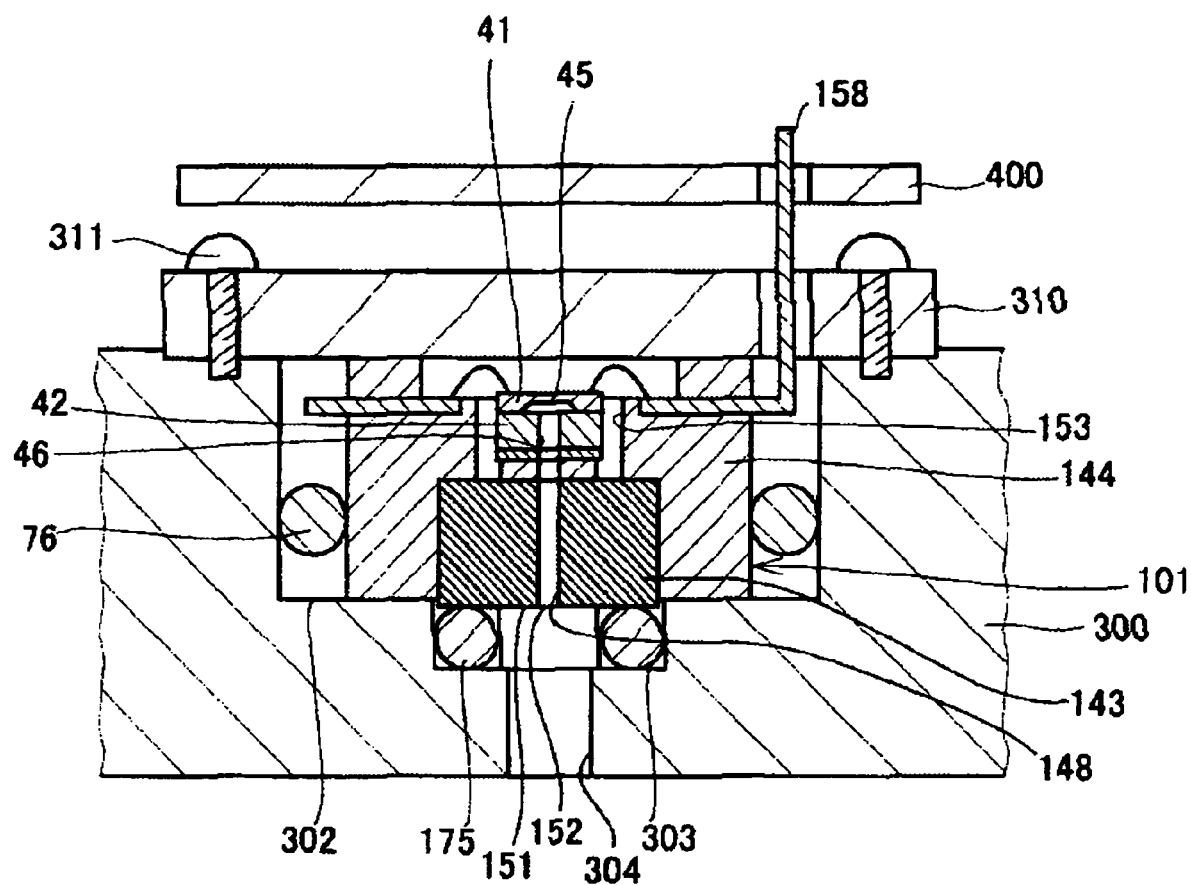
FIG. 7 illustrates a cross section of a fifth embodiment of a pressure sensor device, which incorporates the pressure sensor cell of FIG. 5, according to the present invention.

FIG. 7 is a cross sectional view showing a fifth embodiment of a pressure sensor device according to the present invention. Here, the pressure sensor device is similar to the embodiment of FIG. 3, but includes the pressure sensor cell 101 of the embodiment of FIG. 5 contained in the first stepped recess 302 formed in the enclosure 300, over which the fixture 310 is secured to the enclosure 300 with fasteners 311. The pressure sensor cell 101 is secured by pressure applied from the pressure introducing port 152 and reaction force applied from the fixture 310 against the pressure, as previously disclosed. Again, the protective film 60, which is not illustrated here, can be included to protect the joining member 49.

The second stepped recess 303 formed in the bottom of the first stepped recess 302 accommodates an O-ring 175, which seals the space between the metallic plate member 143 and the enclosure 300. The O-ring 175 in the second stepped recess 303 seals the space between at least the bottom face of the second stepped recess 303 and the open end 151 of the metallic plate member 143. The O-ring 175 prevents the pressure-transmitting medium introduced to the metallic plate member 143 through the through hole 304 in the enclosure 300 from flowing into sections other than the through hole 148 in the metallic plate member 143. Moreover, the signal terminal 158 of the pressure sensor cell 101 is bent and channeled to directly connect to a printed circuit board 400 positioned near the enclosure 300 by connection measures, such as soldering.

Figure 8:
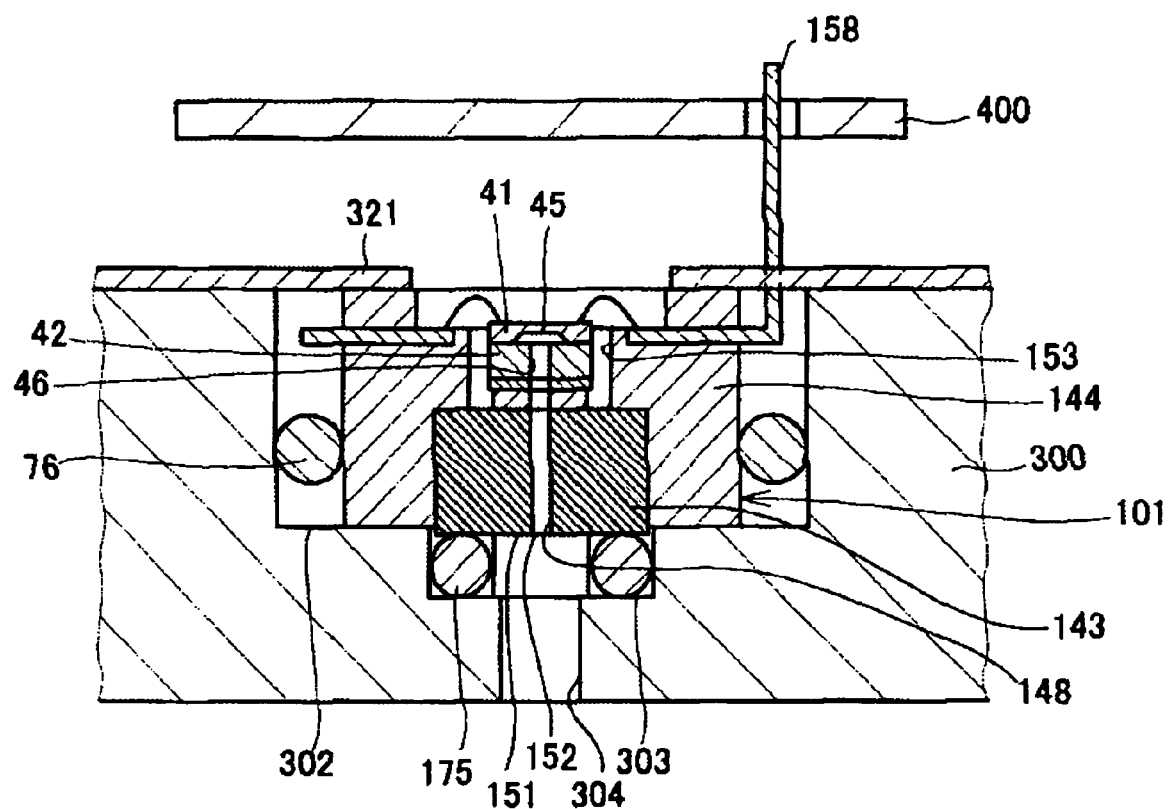
FIG. 8 illustrates a cross section of a sixth embodiment of a pressure sensor device, which incorporates the pressure sensor cell of FIG. 5, according to the present invention.

FIG. 8 is a cross sectional view showing a sixth embodiment of a pressure sensor device according to the present invention. Here, the pressure sensor device is similar to the embodiment of FIG. 4, but instead includes the pressure sensor cell 101 of the embodiment of FIG. 5. Here, instead of securing the pressure sensor cell 101 with the fixture and fasteners 310, 311 as in the embodiment of FIG. 7, the pressure sensor cell 101 contained in the first and second stepped recesses 302 and 303 in the enclosure 300 is secured by bending or crimping the tab 321 extending from the enclosure 300 with a machine or a tool to engage the tab 321 against the resin case 144 of the pressure sensor cell 101. As the fixture and fasteners 310, 311 are eliminated, the number of parts can be reduced more than the embodiment of FIG. 7. Also, the O-ring 175 in the second stepped recess 303 in the enclosure 300 seals the space between at least the bottom face of the second step recess 303 and the open end 151 of the metallic plate member 143. The other arrangements are the same as those of the embodiment of FIG. 7. Again, the protective film 60, which is not illustrated here, can be included to protect the joining member 49.

Figure 9:
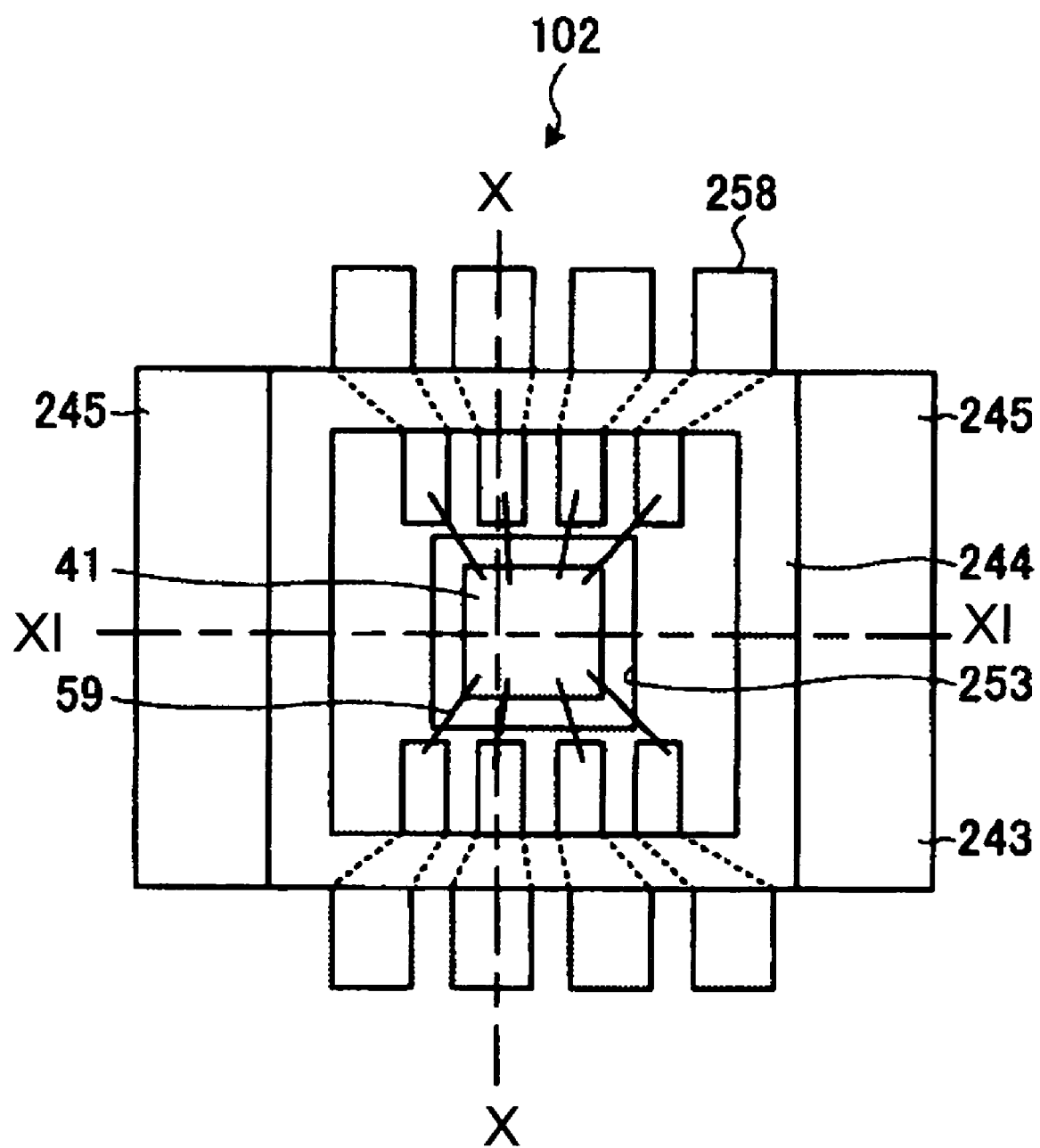
FIG. 9 illustrates a plan view of third embodiment of a pressure sensor cell according to the present invention.
Figure 10:
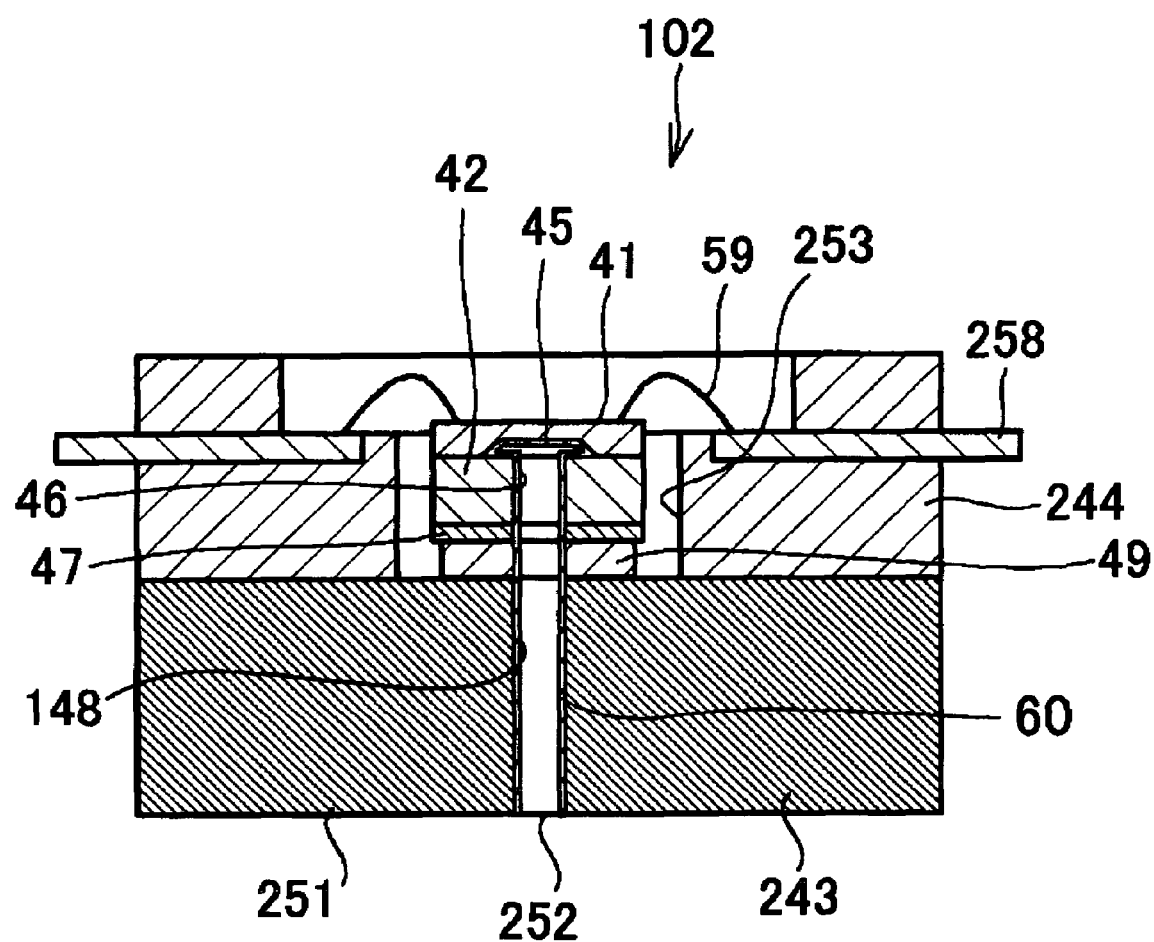
FIG. 10 illustrates a cross section taken along line X-X of FIG. 9.
Figure 11:
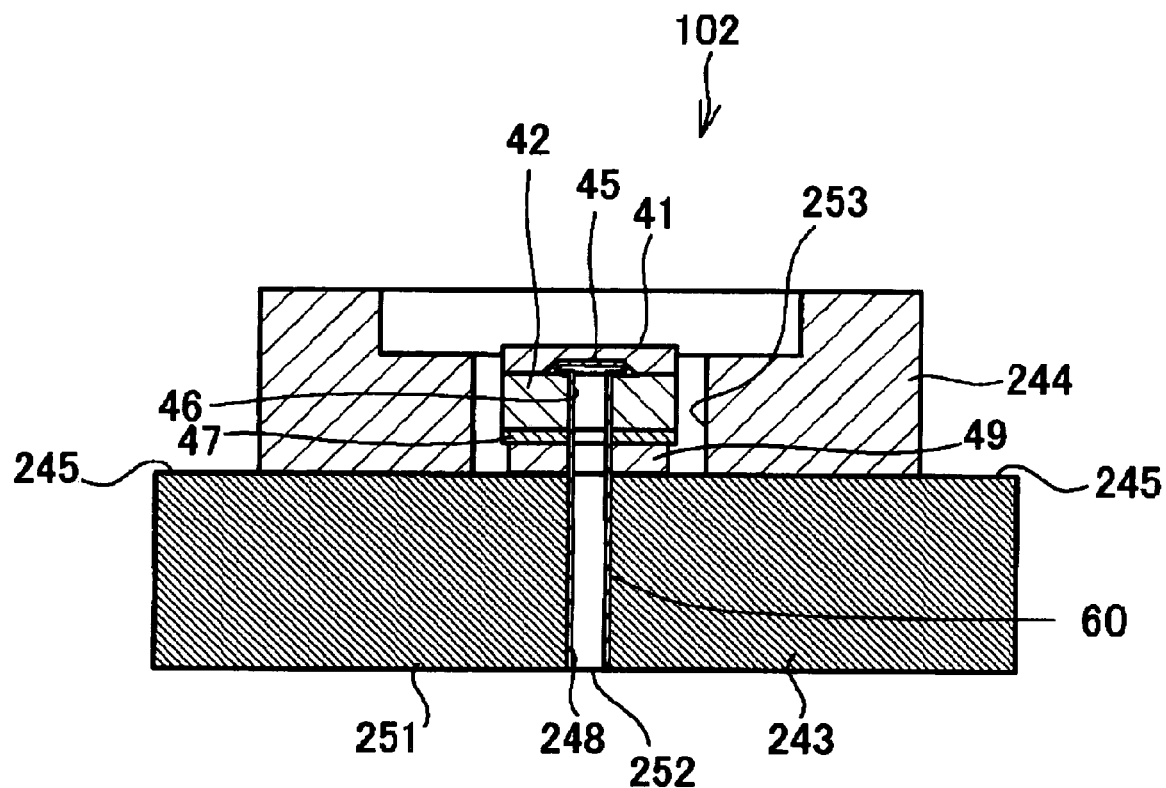
FIG. 11 illustrates a cross section taken along line XI-XI of FIG. 9.

FIG. 9 is a plan view showing a third embodiment of a pressure sensor cell 102 according to the present invention. FIGS. 10 and 11 are cross sectional views of FIG. 9 taken along the line X-X and XI-XI of FIG. 9, respectively. As shown in these figures, the pressure sensor cell 102 includes the pressure sensor chip 41, the base member 42, a metallic plate member 243, and a resin case 244. The arrangement of the pressure sensor chip 41 and the base member 42 is the same as that of the embodiment of FIG. 1.

A metallic thin film 47 layered on the side of the base member 42 facing the metallic pipe member 243 can be composed of three layers, namely a chromium or titanium film, a platinum film, and a gold film, in this order from the side of the base member 42. Chromium has an excellent adhesion property to glass material to maintain a good joint with the glass material and prevent the thin film 47 from prematurely separating from the glass material. Moreover, the platinum film isolates the chromium film and the gold film so that they do not come into contact with each other, i.e., prevent migration problem. Furthermore, the gold film is suitable for the joining of the base member 42 and the metallic pipe member 243, with gold/tin eutectic solder or high temperature solder intervening between them.

The resin case 244 has, though not particularly restricted, a rectangular plane figure with, for example, four signal terminals 258 projecting from each of a pair of opposing sides. The four signal terminals 258 aligned on the one side of the resin case 244 are external connection terminals for outputting the signals of the pressure sensor cell 102. The four signal terminals 258 aligned on the other side of the resin case 244 are internal adjustment terminals for adjusting the characteristics of the pressure sensor cell 102 and can be shorter than the external connection terminals. Moreover, the resin case 244 has a recess 253. The pressure sensor chip 41 and the base member 42 are contained in the recess 253 while exposing the base ends of the signal terminals 258. The exposed portions of the signal terminals 258 and the pressure sensor chip 41 are electrically connected by wire bonding 59. The bottom face of the resin case 244 is bonded to one face of the metallic plate member 243.

Referring to FIG. 11, the metallic plate member 243 protrudes outside from each end face of the resin case 244 where there is no projection of signal terminals 258. The portion of the metallic plate member 243 protruding outside from each end face of the resin case 244 becomes a support 245 with which a different member (such as a connector member 161 of the embodiment of FIGS. 12 and 13) is made to contact for integrating together with the metallic plate member 243. Referring to FIG. 10, on each side with the signal terminals 258 projecting from the resin case 244, the signal terminals 258 project outside more than the end face of the metallic plate member 243.

The metallic plate member 243, though not particularly restricted, can be made of, for example, 42 alloy with a plating for increasing strength of joint with the base member 42. The plating can be nickel plating or a combination of nickel and gold plating. In the center of the metallic plate member 243, a through hole 248 is provided for communicating a pressure-transmitting medium, such as air or oil, therein. The base member 42 and the metallic plate member 243 are joined together with a joining member 49, which can be metallic material such as the gold/tin eutectic solder or the high temperature solder, with the through hole 46 in the base member 42 and the through hole 248 in the metallic plate member 243 aligned to communicate with each other.

Alternatively, the joining member 49 can be an adhesive, such as epoxy adhesive, instead of the metallic material, as explained in the embodiment of FIG. 1.

According to the pressure sensor cell 102 of FIGS. 10 and 11, the pressure-transmitting medium is introduced through the through hole 248 from a pressure introducing port 152 at an open end 251 of the metallic plate member 243. A pressure received by the diaphragm 45 of the pressure sensor chip 41 deforms the diaphragm 45. This varies gauge resistance values of the gauges on the diaphragm 45, by which a voltage signal corresponding to the variation is produced. The voltage signal is amplified by an amplifying circuit, adjusted by adjusting circuits, such as the sensitivity compensating or correcting circuit, the offset compensating or correcting circuit, and the temperature characteristics compensating or correcting circuit, and output from the pressure sensor chip 41. The output signal is then output to the signal terminal 258 through the wire bonding 59.

Here, the pressure-transmitting medium only contacts the inner wall of the metallic plate member 243, the inner wall of the base member 42, and the diaphragm 45 of the pressure sensor chip 41. Therefore, the pressure-transmitting medium, whether in gaseous form, such as an air conditioning medium, or in liquid form, such as oil or lubricant, causes no degradation of the pressure sensor cell 102. This enables the pressure sensor cell 102 to obtain a high reliability for a long time. Moreover, even when high pressure is measured, the area for receiving the pressure is limited only to the area of the diaphragm 45. Therefore, it becomes possible to decrease the size and weight of the pressure sensor device using the pressure sensor cell 102, reducing the cost.

Specifically, when the resin case 244 is made of resin material such as epoxy resin, polyphenylene sulfide (PPS) resin, polybutylene terephthalate (PBT) resin, or nylon resin, like in the embodiment of FIG. 5, sufficient integrity can be assured even with a compressive stress of the order of 1.05 MPa created in the resin case 244. This enables the pressure sensor cell 102 to obtain a high reliability for a long time.

Moreover, like in the embodiment of FIG. 1, the number of connections in a signal transmission path until a signal is output to the outside can be kept to a minimum to significantly lower the failure probability. Moreover, when silicon is used for the material of the base member 42, and the pressure sensor chip 41 and the base member 42 can be joined by using a sealing glass, the thermal stress created in the pressure sensor chip 41 due to the difference in coefficient of thermal expansion between the pressure sensor chip 41 and the metallic plate member 243 can be reduced by the presence of the base member 42. Thus, it is possible to reduce the thermal stress due to the junction with the metallic plate member 243. In addition, the use of the metallic plate member 243 substituted for the metallic pipe member 43 of the embodiment of FIG. 1 can further reduce the material cost.

Figure 12:
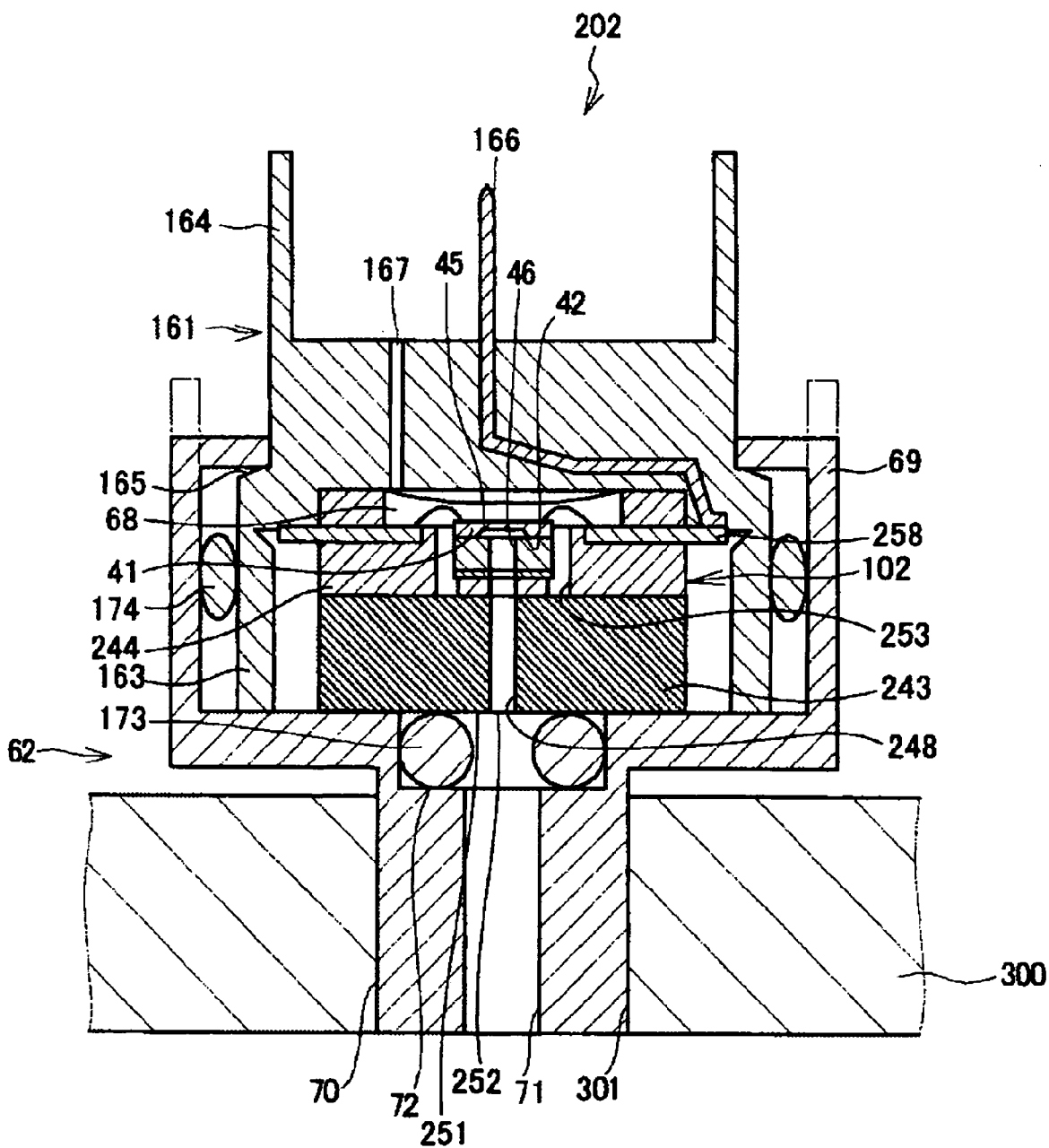
FIG. 12 illustrates a cross section of a seventh embodiment of a pressure sensor device, which incorporates the pressure sensor cell of FIG. 9 (illustrating the cross section of FIG. 10), according to the present invention.
Figure 13:
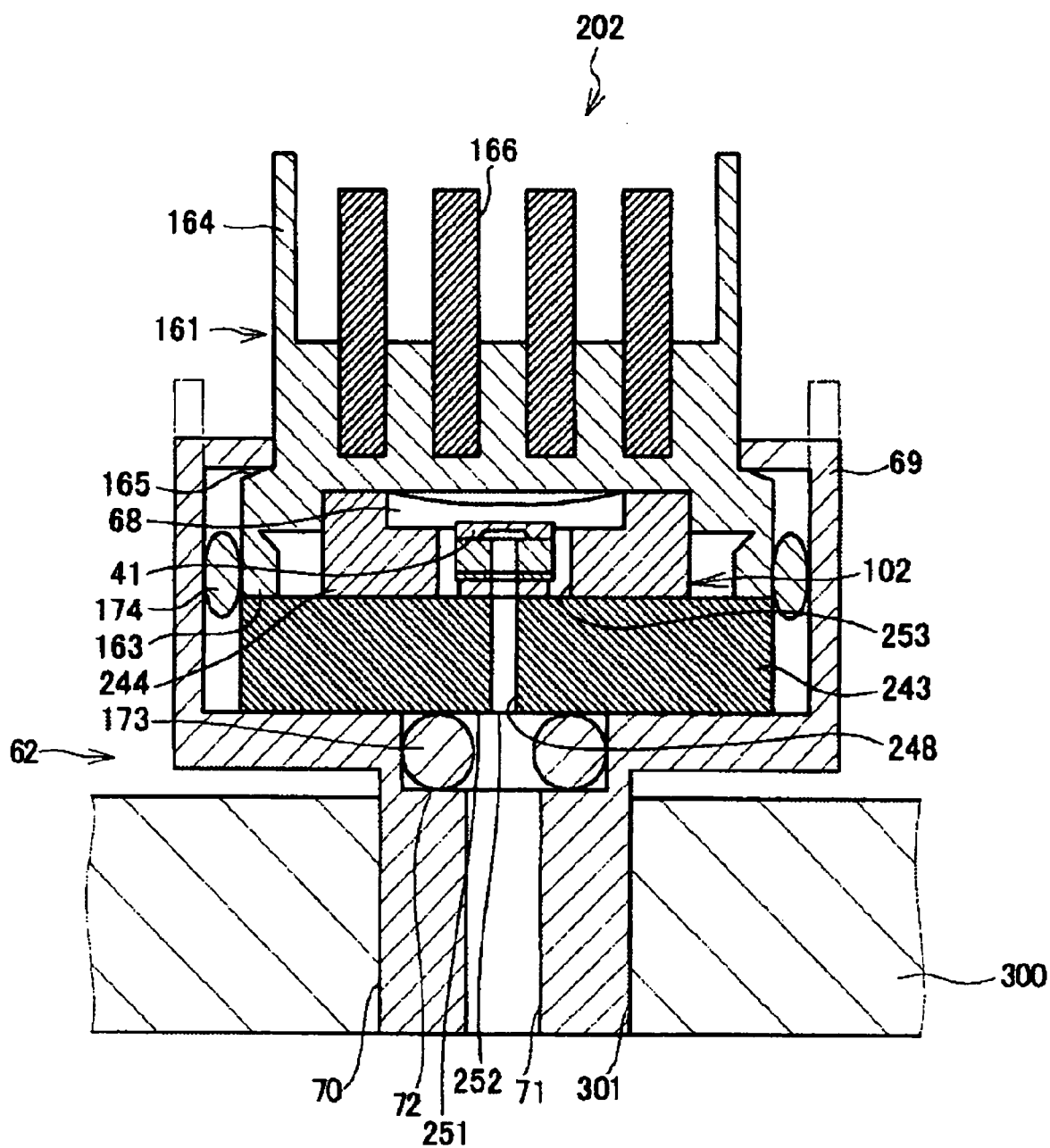
FIG. 13 illustrates a cross section of the pressure sensor device of FIG. 12, illustrating the cross section as shown in FIG. 11.

FIGS. 12 and 13 are cross sectional views of a seventh embodiment of a pressure sensor device 202 according to the present invention. FIGS. 12 and 13 respectively correspond to the cross-sectional views of the pressure sensor cell 102 taken along lines X-X and XI-XI of FIG. 9. Here, the pressure sensor device 202 is similar to the embodiment of FIG. 2, but includes the pressure sensor cell 102 of the embodiment of FIGS. 9-11 held between the connector member 161 and the joint member 62. An end of the joint member 62 is then bent or crimped over around the connector member 161 to engage the same to thereby integrate the pressure sensor cell 102, the connector member 161, and the joint member 62. The arrangement of the joint member 62 is the same as that of the embodiment of FIG. 2. Again, the protective film 60, which is not illustrated here, can be included to protect the joining member 49.

The connector member 161 is formed from a housing section 163 for housing the pressure sensor cell 102, and a socket section 164 for outputting an output of the pressure sensor device 202 to the outside. The housing section 163 and the socket section 164 are integrally molded together. The socket section 164 has a smaller outer diameter or section than that of the housing section 163 so that a stepped portion 165 is formed between the housing section 163 and the socket section 164. A partition is formed between the housing section 163 and the socket section 164, and a signal output terminal 166 for outputting a signal to the outside is embedded in the partitioning portion. One end of the output terminal 166 is exposed in the housing section 163 and the other end thereof is exposed in the socket section 164.

The length, i.e., height, of the bottom end of the housing section 163 from the partition on the side of the metallic plate member 243 with the projecting signal terminals 258 is different from the length on the side of the metallic plate member 243 without the projecting signal terminals 258. As shown in FIG. 12, on the side of the metallic plate member 243 with the projecting signal terminals 258, that is, on the side along the length of the metallic plate member 243, the bottom end of the housing section 163 comes into contact with the bottom face of the joint member 62. As shown in FIG. 13, on the side of the metallic plate member 243 without the projecting signal terminals 258, that is, on the side along the width of the metallic plate member 243, the bottom end of the housing section 163 comes into contact with an upper side of the support 245 (see FIG. 11) of the metal plate 243. This way, the connector member 161 is supported both by the joint member 62 and the metallic plate member 243 so that no excessive load is subjected to the resin case 244 when measuring high pressure.

An end face of the pressure sensor cell 102 on the opposite side of the open end 251 where the pressure introducing port 252 is opened is bonded to an end face (a disposing section) of a partition between the housing section 163 and the socket section 164 of the connector member 161, which end face is exposed in the housing section 163. The bonding can be carried out with an adhesive, such as a silicon or epoxy adhesive or the like. Thus, the connector member 161 and the pressure sensor cell 102 are integrated together. With the pressure sensor cell 102 thus bonded to the connector member 161, the reliability of the device under action of mechanical force, such as vibration or shock, can be further increased. Moreover, the root of the output terminal 166 exposed in the housing section 163 can be electrically connected to the signal terminal 258 of the pressure sensor cell 102 by laser welding.

In the partition between the housing section 163 and the socket section 164, a through hole 167 is provided to communicate the space in the recess 253 containing the pressure sensor chip 41 in the resin case 244 of the pressure sensor cell 102 with the ambient. Moreover, the recess 253 can be filled with, for example, gel 68 for protecting the pressure sensor chip 41.

The joint member 62 has a securing section for securing the housing section 163 of the connector member 161. A containing section 69 of the joint member 62 is positioned over the housing section 163 of the connector member 161 in which the pressure sensor cell 102 is bonded. A top end rim of the containing section 69 is bent or crimped over along the stepped portion 165 around the connector member 161 by means of a tool or a machine to engage the stepped portion 165. This allows the joint member 62 and the connector member 161 to be secured to each other. The securing can be carried out by a method other than bending or crimping, for example, by bonding.

In the pressure sensor device 202, the pressure-transmitting medium enclosed in the space in the enclosure 300 is introduced to the diaphragm 45 of the pressure sensor chip 41 through the through hole 71 in the threaded section 70 of the joint member 62 and the respective through holes 248 and 46 of the metallic plate member 243 and the base member 42 in the pressure sensor cell 102. Moreover, the recess 72 formed in the bottom of the containing section 69 of the joint member 62 accommodates an O-ring 173, as a sealing measure. The O-ring 173, in the recess 72 of the containing section 69, seals the space between at least the bottom face of the recess 72 and the open end 251 of the metallic plate member 243. The O-ring 73 prevents the pressure-transmitting medium, introduced to the metallic plate member 243 through the through hole 71 in the threaded section 70, from flowing into sections other than the through hole 248 in the metallic plate member 243. Moreover, an O-ring 174 is also provided between the outer side face of the housing section 163 of the connector member 161 and the inner side face of the containing section 69 of the joint member 62 to seal the space therebetween. The O-ring 174 prevents the pressure-transmitting medium from leaking out if there is a failure, such as leakage of the pressure-transmitting medium from the metallic plate member 243, breakage of the pressure sensor chip 41, or separation of the joined interface of the pressure sensor chip 41 and the base member 42.

A simple arrangement according to the seventh embodiment can reduce the material cost and the assembly cost. Moreover, when the pressure sensor device 202 is screwed to the enclosure 300, the stress created in the threaded section 70 is applied to the pressure sensor chip 41 through the O-ring 173. Therefore, the O-ring can lessen the applied stress to the pressure sensor chip 41 to enhance accuracy and reliability of measurement. Moreover, the output terminals 166 for outputting a signal to the outside are disposed on the opposite side to the opening for introducing the pressure-transmitting medium.

Furthermore, the load acting on the pressure sensor cell 102 by the pressure-transmitting medium is determined by a third area defined by a line of contact between the open end 251 of the metallic plate member 243 and the O-ring 173. In comparison, in the embodiment of FIG. 2, the load acting on the pressure sensor cell 100 is determined by the second area, as previously explained. Since the third area is smaller than the second area, the load acting on the pressure sensor cell 102 becomes smaller than the magnitude of the load in the embodiment of FIG. 2. Therefore, the pressure sensor device 202 is suitable for measuring higher pressure than the pressure sensor device 200 of FIG. 2. Moreover, the arrangement in the embodiment of FIGS. 12 and 13 is such that no excessive load is subjected to the resin case 244 as previously explained, and is thus suitable for measuring higher pressure than the pressure sensor device 201 of the embodiment of FIG. 6.

Figure 14:
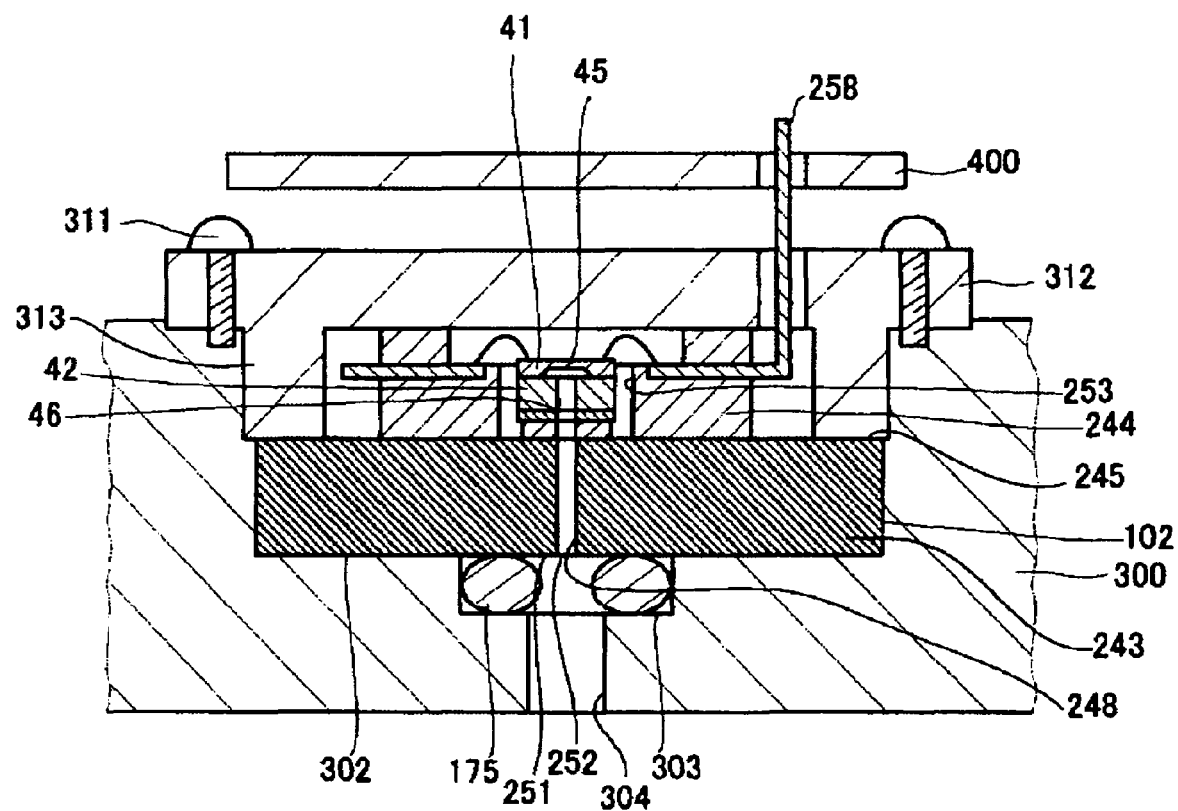
FIG. 14 illustrates a cross section of an eighth embodiment of a pressure sensor device, which incorporates the pressure sensor cell of FIG. 9, according to the present invention.

FIG. 14 is a cross sectional view showing an eighth embodiment of a pressure sensor device according to the present invention. Here, the pressure sensor device is similar to the embodiment of FIG. 3, but includes the pressure sensor cell 102 of the embodiment of FIGS. 9-11 contained in the first stepped recess 302 formed in the enclosure 300, over which a fixture 312 is set to be secured to the enclosure 300 with fasteners 311. On the bottom face of the fixture 312, downwardly protruding members 313 extend downwardly and each are brought into contact with the upper side of the support 245. The pressure sensor cell 102 is secured by pressure applied from the pressure introducing port 252 and reaction force applied from the fixture 312 against the pressure. Again, the protective film 60, which is not illustrated here, can be included to protect the joining member 49.

The second stepped recess 303 formed in the bottom of the first stepped recess 302 accommodates an O-ring 175, which seals the space between the metallic plate member 243 and the enclosure 300. The O-ring 175, in the second stepped recess 303, seals the space between at least the bottom face of the second stepped recess 303 and the open end 251 of the metallic plate member 243. The O-ring 175 prevents the pressure-transmitting medium introduced to the metallic plate member 243 through the through hole 304 in the enclosure 300 from flowing into sections other than the through hole 248 in the metallic plate member 243.

Moreover, the signal terminal 258 of the pressure sensor cell 102 is bent and channeled to directly connect to a printed circuit board 400 positioned near the enclosure 300 by connection measures, such as soldering. The metallic plate member can be disk-like or of a shape with the support 245 provided over all around the periphery of the disk.

Figure 15:
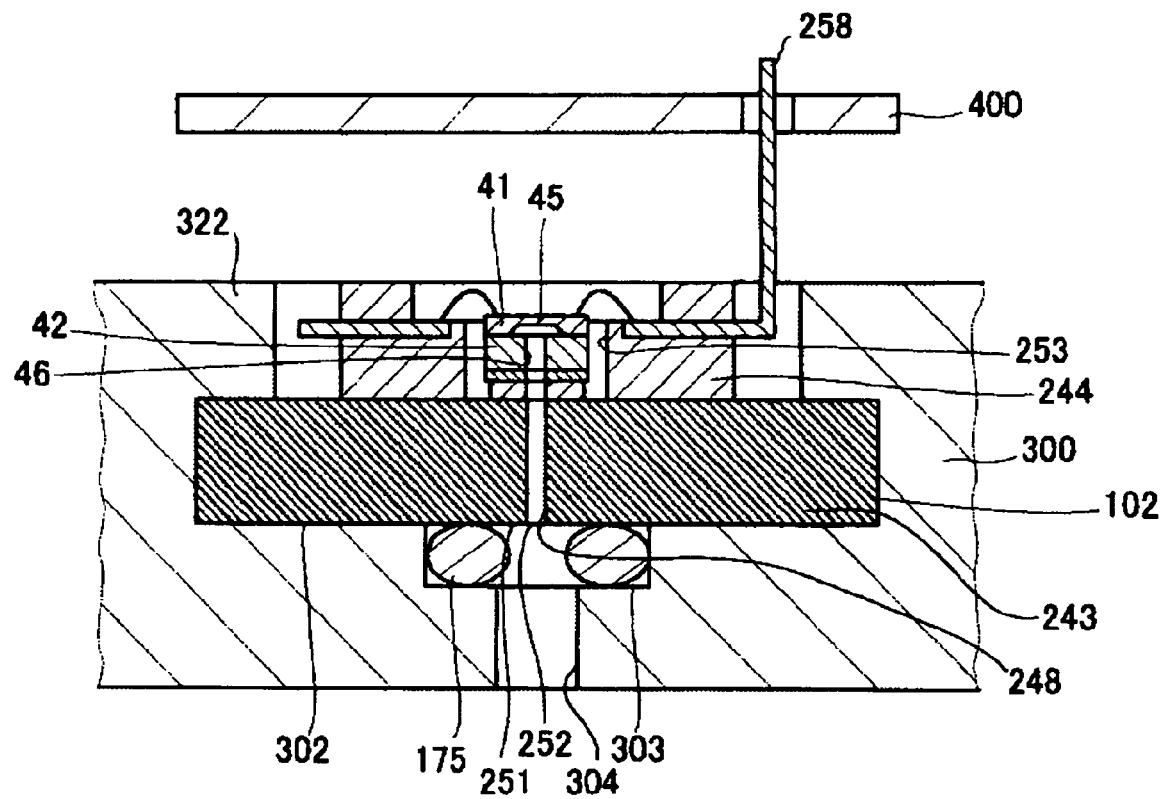
FIG. 15 illustrates a cross section of a ninth embodiment of a pressure sensor device, which incorporates the pressure sensor cell of FIG. 9, according to the present invention.

FIG. 15 is a cross sectional view showing a ninth embodiment of a pressure sensor device according to the present invention. Here, the pressure sensor device is similar to the embodiment of FIG. 14, but instead of securing the pressure sensor cell 102 with the fixture and fasteners 310, 311, the support 245 of the metallic plate member 243 contained in the first stepped recess 302 in the enclosure 300 is secured by bending a tab or crimping portion 322 extending upwardly from the enclosure 300 with a machine or a tool to engage the tab 322 against the support 245. Therefore, in this embodiment, the fixture and screws 310, 311 are eliminated, by which the number of parts is reduced. Also, the O-ring 175, in the second stepped recess 303 in the enclosure 300, seals the space between at least the bottom face of the second stepped recess 303 and the open end 251 of the metallic plate member 243. The other arrangements are the same as those of the embodiment of FIG. 14. Again, the protective film 60, which is not illustrated here, can be included to protect the joining member 49.

Figure 16:
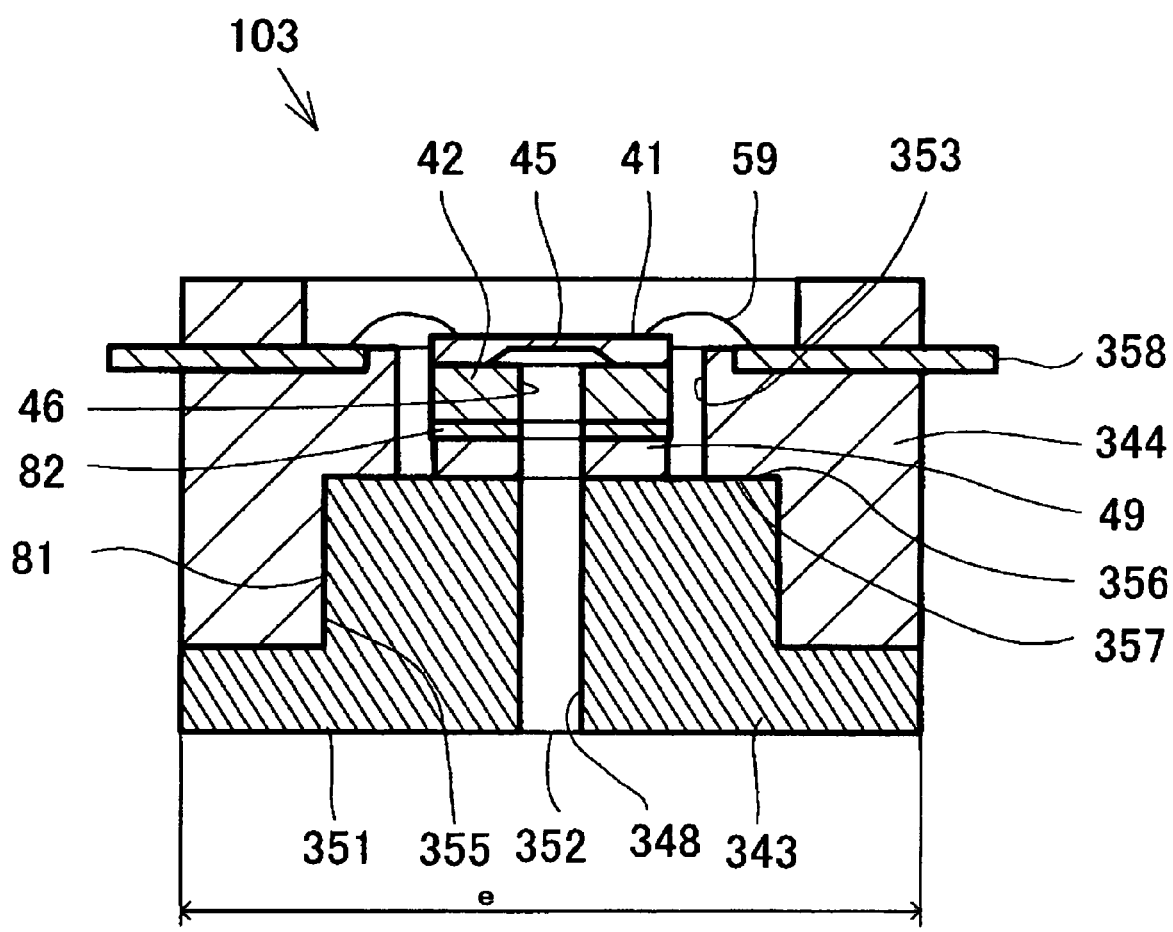
FIG. 16 illustrates a cross section of a fourth embodiment of a pressure sensor cell according to the present invention.
Figure 17:
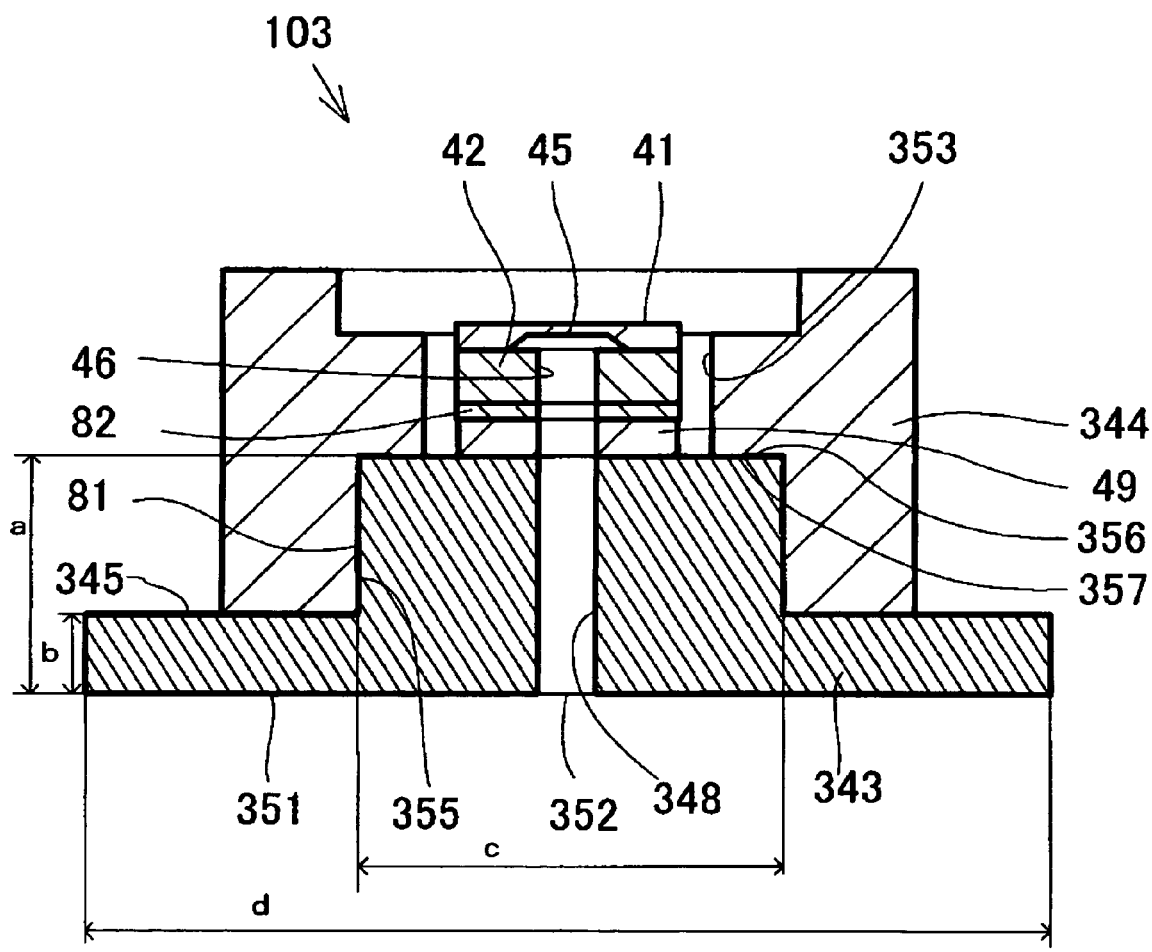
FIG. 17 illustrates another cross-sectional view of the embodiment of FIG. 16.

FIGS. 16 and 17 are cross-sectional views showing a fourth embodiment of a pressure sensor cell 103 according to the present invention. FIGS. 16 and 17 respectively correspond to the cross-sectional views of the pressure sensor cell 103 taken along lines X-X and XI-XI in FIG. 9. In this embodiment, the pressure sensor cell 103 includes a pressure sensor chip 41, a base member 42, a metallic plate member 343, and a resin case 344. The arrangement of the pressure sensor chip 41 and the base member 42 is the same as that of the embodiment of FIG. 1.

The resin case 344 has, though not particularly restricted, a rectangular plane figure with, for example, four signal terminals 358 projecting from each of a pair of opposing sides. The four signal terminals 358 aligned on one side of the resin case 344 are external connection terminals for outputting the signals of the pressure sensor cell 103 to the outside. The four signal terminals 358 aligned on the other side of the resin case 244 are internal adjustment terminals for adjusting the characteristics of the pressure sensor cell 103 and can be shorter than the external connection terminals.

Moreover, the resin case 344 has a first recess 353 on the side of one end thereof. The pressure sensor chip 41 and the base member 42 are contained or positioned in the first recess 353, and the base ends of the signal terminals 358 are exposed in the first recess 353. The exposed portions of the signal terminals 358 and the pressure sensor chip 41 are electrically connected by wire bonding 59. On the opposite end of the resin case 344, opposite to the first recess 353, a second recess 355 having an opening area larger than that of the first recess 353 and communicating with the first recess 353 is formed. The first recess 353 and the second recess 355 form a through hole section that extend through the resin case 344. The metallic plate member 343 has a protruding portion 81 that is seated or accommodated in the second recess 355. An opening section of the through hole 348 at an open end 351 of the metallic plate member 343 is referred to as a pressure introducing port 352. A face 356 on the opposite side of the pressure introducing port 352 of the protruding portion 81 is bonded to a bottom face 357 (uppermost portion in the illustration) of the second recess 355 facing and contacting the face 356.

Referring to FIG. 17, the metallic plate member 343 protrudes beyond each of the end faces (on the side where no signal terminals 358 protrude) of the resin case 344. Each portion of the metallic plate member 343 protruding beyond the respective end face of the resin case 344 acts as a support 345 for making contact with another member (e.g., a connector member 161) to be integrated with the metallic plate member 343. Referring to FIG. 16, on each of the sides where the signal terminals 358 protrude out from the resin case 344, the signal terminals 358 protrude beyond the end face of the metallic plate member 343.

The metallic plate member 343, though not particularly restricted, can be made of, for example, 42 alloy with a plating for increasing strength of joint with the base member 42. The plating can be a nickel plating or a combination of nickel and gold plating. In the center of the metallic plate member 343, a through hole 348 is provided for communicating a pressure-transmitting medium, such as air or oil, therein. The base member 42 and the metallic plate member 343 can be joined together with a joining member, which can be an adhesive 82 such as an epoxy adhesive, with the through hole 46 of the base member 42 and the through hole 348 of the metallic plate member 343 aligned to communicate with each other. The joining member also can include the metallic material 49, such as gold/tin eutectic solder or high temperature solder, as explained in the embodiment of FIG. 1. Alternatively, the metallic joining member 49 can be used with the metal thin film 47 instead of the adhesive 82, as explained in the embodiment of FIG. 1.

The protruding portion 81 can be cylindrical. When the pressure from the pressure-transmitting medium applies a load sufficient to bend the support 345, the bending action stress the pressure sensor cell 103. Such stress can vary the output from the pressure sensor chip 41, leading to inaccuracies. Here, the protruding portion 81 can reduced stress as compared with the metallic plate member without such protrusion, i.e., flat metallic plate as illustrated in the embodiment of FIG. 9. In the embodiment of FIG. 9, as the measured pressure becomes higher, the thickness of the metallic plate member 243 as a whole needs to be increased to reduce the influence of stress caused by the measured pressure. Here, however, there is no need to increase the thickness of the metallic plate member 343 as a whole. Accordingly, the cost of the metallic plate member can be reduced. Again, the protective film 60, which is not illustrated here, can be included to protect the adhesive 82.

In the pressure sensor cell 103 according to the embodiment of FIGS. 16 and 17, the pressure-transmitting medium is introduced via the through hole 348 in the metallic plate member 343. The pressure applied to the diaphragm 45 of the pressure sensor chip 41 deforms the diaphragm 45. This varies resistance values of the gauges on the diaphragm 45, by which a voltage signal corresponding to the variation is produced. The voltage signal is amplified by an amplifying circuit, adjusted by adjusting circuits, such as the sensitivity compensating or correcting circuit, the offset compensating or correcting circuit, and the temperature characteristics compensating or correcting circuit, and output from the pressure sensor chip 41, as previously disclosed. The output signal is then output to the signal terminal 358 through the wire bonding 59.

Here, the pressure-transmitting medium is only in contact with the inner wall of the metallic plate member 343, the inner wall of the base member 42 and the diaphragm 45 of the pressure sensor chip 41. Therefore, the pressure-transmitting medium, whether in gaseous form, such as an air conditioning medium, or in liquid form, such as oil or lubricant, does not degrade the pressure sensor cell 103. This enables the pressure sensor cell 103 to obtain a high reliability for a long time. Moreover, even when high pressure is measured, the area for receiving the pressure is limited only to the area of the diaphragm 45. Therefore, the signal terminals 358 can be disposed in an inexpensive resin case integrated with the pressure sensor cell, making it possible to reduce the size and weight of the pressure sensor device using the pressure sensor cell 103. A low-cost pressure sensor device can thus be realized.

Like in other embodiments, the material of the resin case 344 can be an epoxy resin, a polyphenylene sulfide (PPS) resin, a polybutylene terephthalate (PBT) resin, a nylon resin or the like. Even with the compressive stress of the order of 1.05 MPa generated on the resin case 344, sufficient integrity can be assured. This enables the pressure sensor cell 101 to realize a high reliability for a long time.

Moreover, like the embodiment of FIG. 1, the number of connections in the signal transmission path to the outside can be kept to a minimum to significantly lower the failure probability. Moreover, when silicon is used for the material of the base member 42, and the pressure sensor chip 41 and the base member 42 are joined by using a sealing glass, the thermal stress created in the pressure sensor chip 41 due to the difference in coefficient of thermal expansion between the pressure sensor chip 41 and the metallic plate member 343 is reduced by the presence of or absorbed by the base member 42. Thus, it is possible to reduce the thermal stress due to the junction with the metallic plate member 343. The use of the metallic plate member 343 instead of the metallic pipe member 43 of the embodiment of FIG. 1 can further reduce the material cost.

Figure 18:
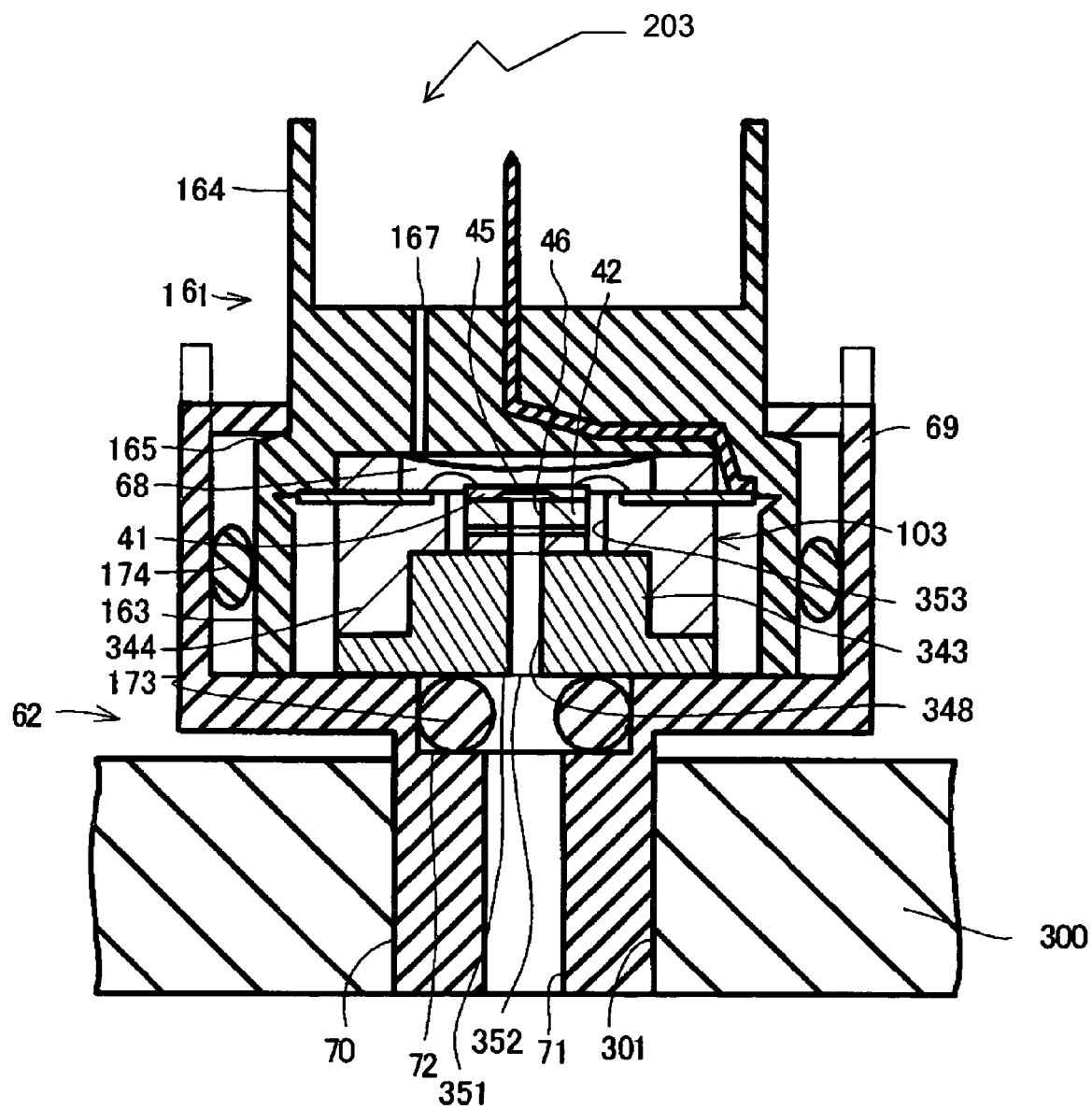
FIG. 18 illustrates a cross section of a tenth embodiment of a pressure sensor device, which incorporates the pressure sensor cell of FIGS. 16 and 17 (illustrating the cross section of FIG. 16), according to the present invention.
Figure 19:
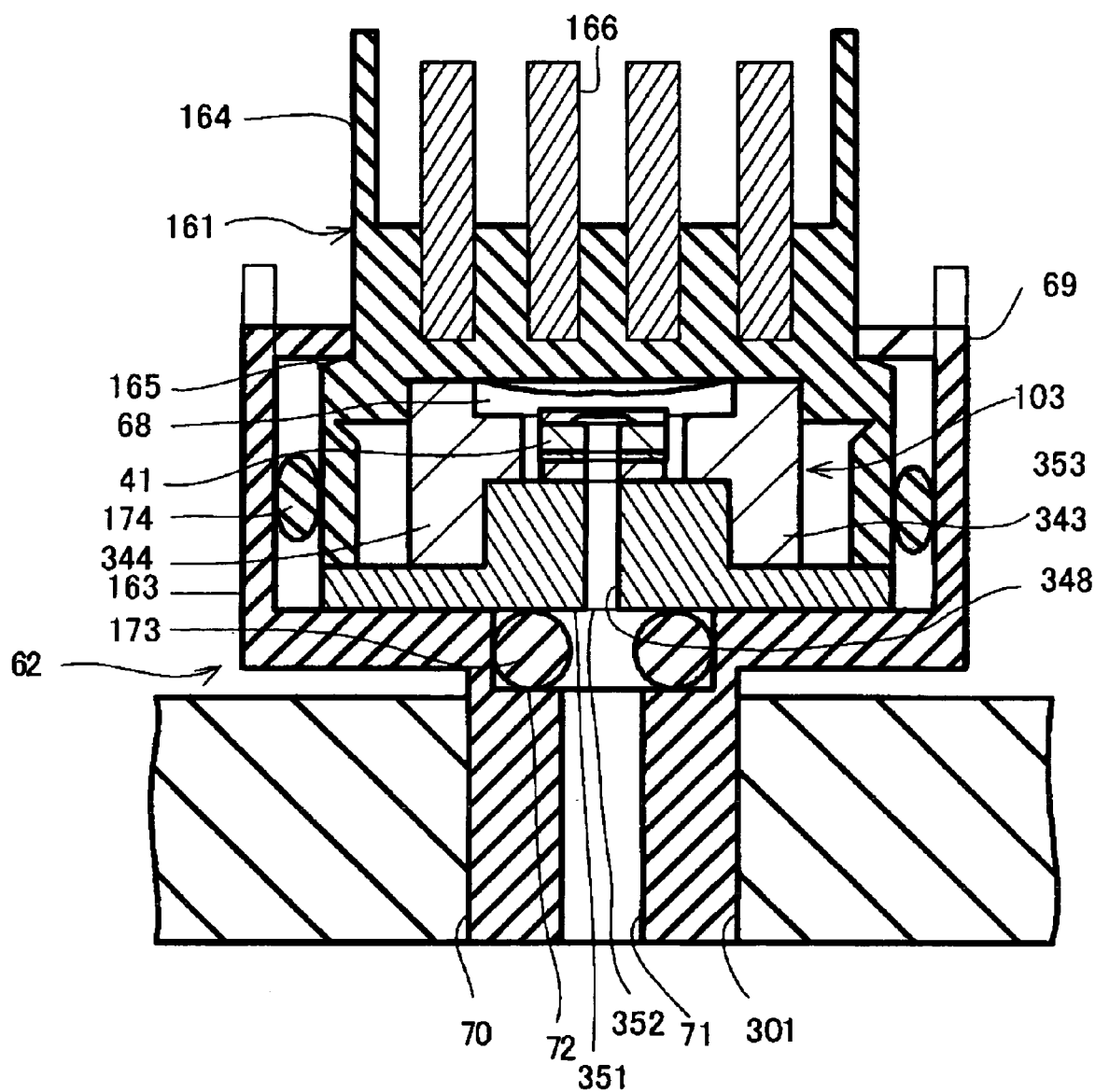
FIG. 19 illustrates a cross section of the pressure sensor device of FIG. 18, illustrating the cross section as shown in FIG. 17.

FIGS. 18 and 19 are cross-sectional views showing a tenth embodiment of a pressure sensor device 203 according to the present invention. FIGS. 18 and 19 respectively correspond to the cross-sectional views of the pressure sensor cell 103 taken along lines X-X and XI-XI of FIG. 9. Here, the pressure sensor device 203 is similar to the embodiment of FIGS. 12 and 13, but includes the pressure sensor cell 103 of the embodiment of FIGS. 16-17 held between the connector member 161 and the joint member 62. An end of the joint member 62 is then bent or crimped over around the connector member 161 to engage the same to thereby integrate the pressure sensor cell 103, the connector member 161, and the joint member 62. The arrangement of the joint member 62 is the same as that of the embodiment of FIGS. 12 and 13.

The connector member 161 is formed from a housing section 163 for housing the pressure sensor cell 103, and a socket section 164 for outputting an output of the pressure sensor device 203 to the outside. The housing section 163 and the socket section 164 are integrally molded together. The socket section 164 has a smaller outer diameter or section than that of the housing section 163 so that a stepped portion 165 is formed between the housing section 163 and the socket section 164. A partition is formed between the housing section 163 and the socket section 164, and a signal output terminal 166 for outputting a signal to the outside is embedded in the partitioning portion. One end of the output terminal 166 is exposed in the housing section 163 and the other end thereof is exposed in the socket section 164.

The length, i.e., height, of the bottom end of the housing section 163 from the partition on the side of the metallic plate member 343 with the projecting signal terminals 358 is different from the length on the side of the metallic plate member 343 without the projecting signal terminals 358. As shown in FIG. 18, on the side of the metallic plate member 343 with the projecting signal terminals 358, i.e., on the side along the length of the metallic plate member 343, the bottom end of the housing section 163 comes into contact with the bottom face of the joint member 62. As shown in FIG. 19, on the side of the metallic plate member 343 without the projecting signal terminals 358, i.e., on the side along the width of the metallic plate member 343, the bottom end of the housing section 163 comes into contact with an upper side of the support 345 (see FIG. 17) of the metal plate 343. This way, the connector member 161 is supported both by the joint member 62 and the metallic plate member 343 so that no excessive load is subjected to the resin case 344 when measuring high pressure.

An end face of the pressure sensor cell 103 exposed in the housing section 163, namely on the opposite side of the open end 351 where the pressure introducing port 352 is opened, is bonded to an end face (a disposing section) of the partition between the housing section 163 and the socket section 164 of the connector member 161. Bonding can be carried out with an adhesive, such as a silicon or epoxy adhesive or the like. Thus, the connector member 161 and the pressure sensor cell 103 can be integrated together. With the pressure sensor cell 103 thus bonded to the connector member 161, the reliability of the device under action of mechanical force, such as vibration or shock, can be further increased. Moreover, the root of the output terminal 166 exposed in the housing section 163 can be electrically connected to the signal terminal 358 of the pressure sensor cell 103 by laser welding.

In the partition between the housing section 163 and the socket section 164, a through hole 167 is provided to communicate the space in the recess 353 containing the pressure sensor chip 41 in the resin case 344 of the pressure sensor cell 103 with the ambient. Moreover, the recess 353 can be filled with, for example, gel 68 for protecting the pressure sensor chip 41.

The joint member 62 has a securing section for securing the housing section 163 of the connector member 161. A containing section 69 of the joint member 62 is positioned over the housing section 163 of the connector member 161 in which the pressure sensor cell 103 is bonded. A top end rim of the containing section 69 is bent or crimped over along the stepped portion 165 around the connector member 161 by means of a tool or a machine to engage the stepped portion 165. This allows the joint member 62 and the connector member 161 to be secured to each other. The securing can be carried out by a method other than bending or crimping, for example, by bonding.

In the pressure sensor device 203, the pressure-transmitting medium enclosed in the space in the enclosure 300 is introduced to the diaphragm 45 of the pressure sensor chip 41 through the through hole 71 in the threaded section 70 of the joint member 62 and the respective through holes 348 and 46 of the metallic plate member 343 and the base member 42 in the pressure sensor cell 103. Moreover, the recess 72 formed in the bottom of the containing section 69 of the joint member 62 accommodates an O-ring 173, as a sealing measure. The O-ring 173, in the recess 72 of the containing section 69, seals the space between at least the bottom face of the recess 72 and the open end 351 of the metallic plate member 343. The O-ring 73 prevents the pressure-transmitting medium, introduced to the metallic plate member 343 through the through hole 71 in the threaded section 70, from flowing into sections other than the through hole 348 in the metallic plate member 343.

Moreover, an O-ring 174 is also provided between the outer side face of the housing section 163 of the connector member 161 and the inner side face of the containing section 69 of the joint member 62 to seal the space therebetween. The O-ring 174 prevents the pressure-transmitting medium from leaking out if there is a failure, such as leakage of the pressure-transmitting medium from the metallic plate member 343, breakage of the pressure sensor chip 41, or separation of the joined interface of the pressure sensor chip 41 and the base member 42.

A simple arrangement according to the tenth embodiment of the device can reduce the material cost and the assembly cost. Moreover, when the pressure sensor device 203 is screwed to the enclosure 300, the stress created in the threaded section 70 can be applied to the pressure sensor chip 41 through the O-ring 173. Therefore, the O-ring 173 can lessen the stress applied to the pressure sensor chip 41 to enhance accuracy and reliability of measurement. Moreover, the output terminals 166 for outputting a signal to the outside can be disposed on the opposite side to the opening for introducing the pressure-transmitting medium.

Furthermore, the load acting on the pressure sensor cell 103 by the pressure-transmitting medium is determined by a fourth area defined by a line of contact between the open end 351 of the metallic plate member 343 and the O-ring 173. In comparison, in the embodiment of FIG. 2, the load acting on the pressure sensor cell 100 is determined by the second area, as previously explained. Since the fourth area is smaller than the second area, the load acting on the pressure sensor cell 102 becomes smaller than the magnitude of the load in the embodiment of FIG. 2. Therefore, the pressure sensor device 203 is suitable for measuring higher pressure than the pressure sensor device 200 of FIG. 2. Moreover, the arrangement in the present embodiment is such that no excessive load is subjected to the resin case 244 as previously explained, and is thus suitable for measuring higher pressure than the pressure sensor device 201 of the embodiment of FIG. 6.

Figure 20:
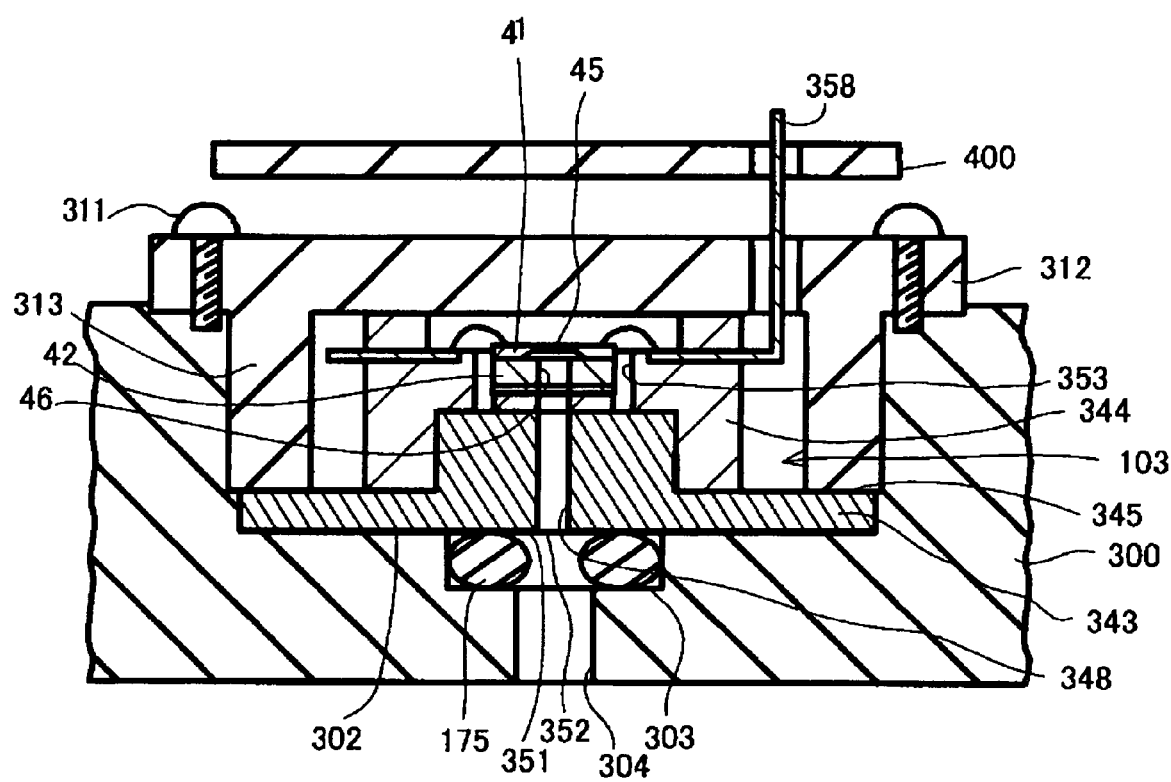
FIG. 20 illustrates a cross section of an eleventh embodiment of a pressure sensor device, which incorporates the pressure sensor cell of FIGS. 16 and 17 (illustrating the cross section of FIG. 17), according to the present invention.

FIG. 20 is a cross sectional view showing an eleventh embodiment of a pressure sensor device according to the present invention. Here, the pressure sensor device is similar to the embodiment of FIG. 14, but includes the pressure sensor cell 103 of the embodiment of FIGS. 16 and 17 contained in the first stepped recess 302 formed in the enclosure 300, over which a fixture 312 is set to be secured to the enclosure 300 with fasteners 311. On the bottom face of the fixture 312, downwardly protruding members 313 extend downwardly and each are brought into contact with the upper side of the support 345. The pressure sensor cell 103 is secured by pressure applied from the pressure introducing port 352 and reaction force applied from the fixture 312 against the pressure. Again, the protective film 60, which is not illustrated here, can be included to protect the adhesive 82.

A second stepped recess 303 formed in the bottom of the first stepped recess 302 accommodates an O-ring 175, which seals the space between the metallic plate member 343 and the enclosure 300. The O-ring 175, in the second stepped recess 303, seals the space between at least the bottom face of the second stepped recess 303 and the open end 351 of the metallic plate member 343. The O-ring 175 prevents the pressure-transmitting medium introduced to the metallic plate member 343 through the through hole 304 in the enclosure 300 from flowing into sections other than the through hole 348 in the metallic plate member 343.

Moreover, the signal terminal 358 of the pressure sensor cell 103 is bent and channeled to directly connect to a printed circuit board 400 positioned near the enclosure 300 by connection measures, such as soldering. The metallic plate member can be disk-like or of a shape with the support 345 provided over all around the periphery of the disk.

Figure 21:
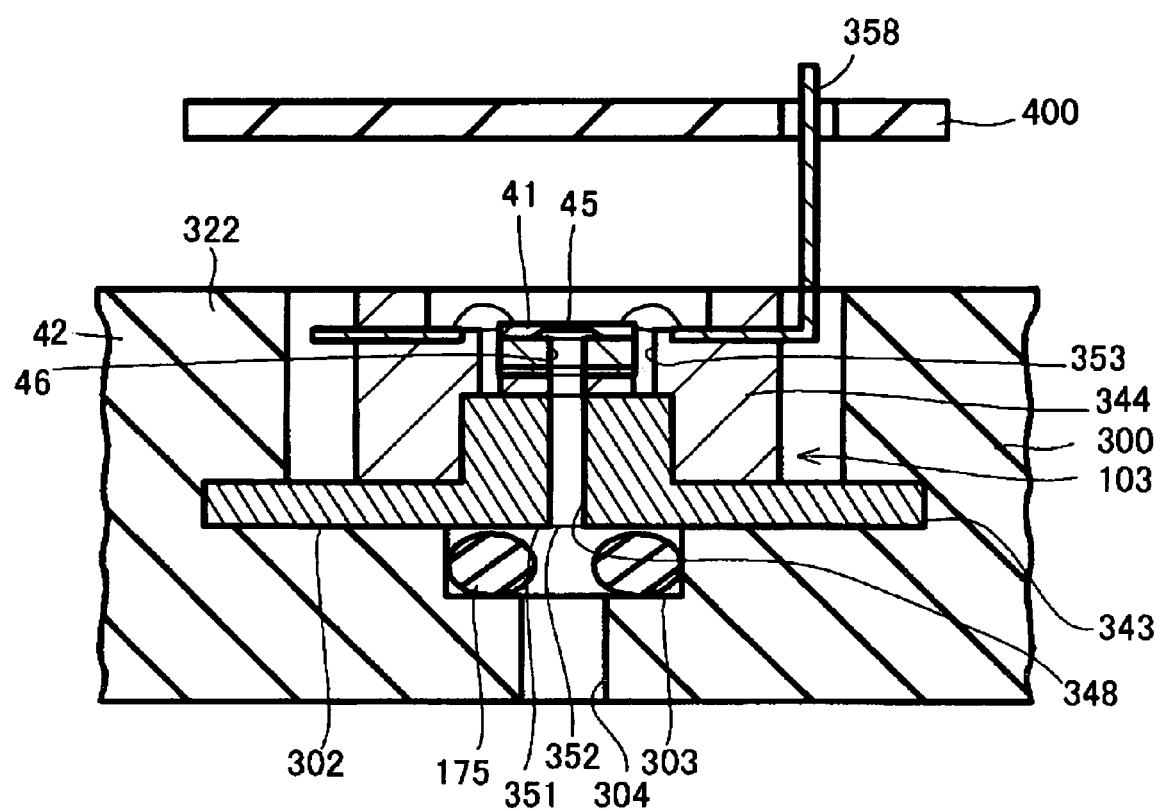
FIG. 21 illustrates a cross section of a twelfth embodiment of a pressure sensor device, which incorporates the pressure sensor cell of FIGS. 16 and 17 (illustrating the cross section of FIG. 17), according to the present invention.

FIG. 21 is a cross sectional view showing a twelfth embodiment of a pressure sensor device according to the present invention. Here, the pressure sensor device is similar to the embodiment of FIG. 15, but instead of securing the pressure sensor cell 103 with the fixture and fasteners 310, 311, the support 345 of the metallic plate member 343 contained in the first stepped recess 302 in the enclosure 300 is secured by bending a tab or crimping portion 322 extending upwardly from the enclosure 300 with a machine or a tool to make the tab 322 engage the support 345. Therefore, in this embodiment, the fixture and screws 310, 311 are eliminated, by which the number of parts is reduced. Also, the O-ring 175, in the second stepped recess 303 in the enclosure 300, seals the space between at least the bottom face of the second stepped recess 303 and the open end 351 of the metallic plate member 343. The other arrangements are the same as those of the embodiment of FIG. 15. Again, the protective film 60, which is not illustrated here, can be included to protect the adhesive 82.

Figure 22:
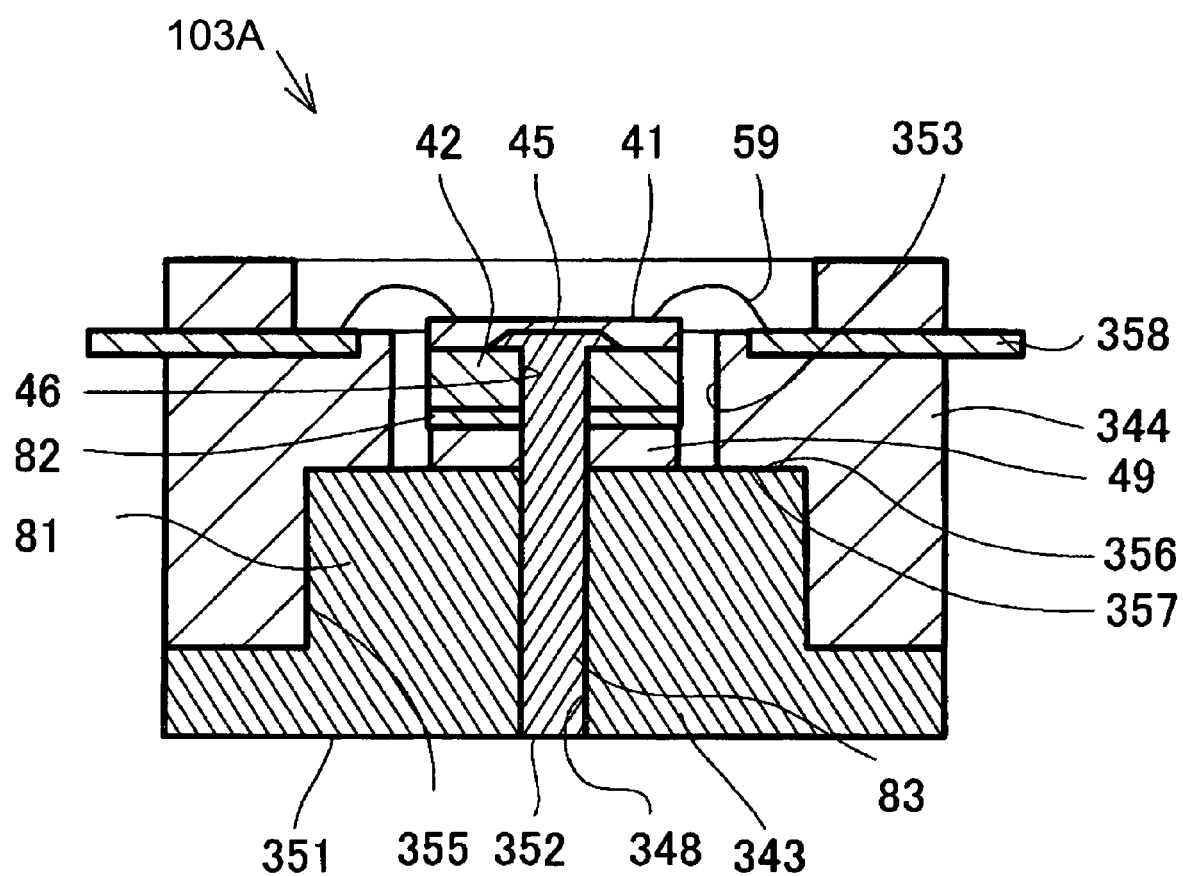
FIG. 22 illustrates a cross section of a fifth embodiment of a pressure sensor cell according to the present invention.
Figure 23:
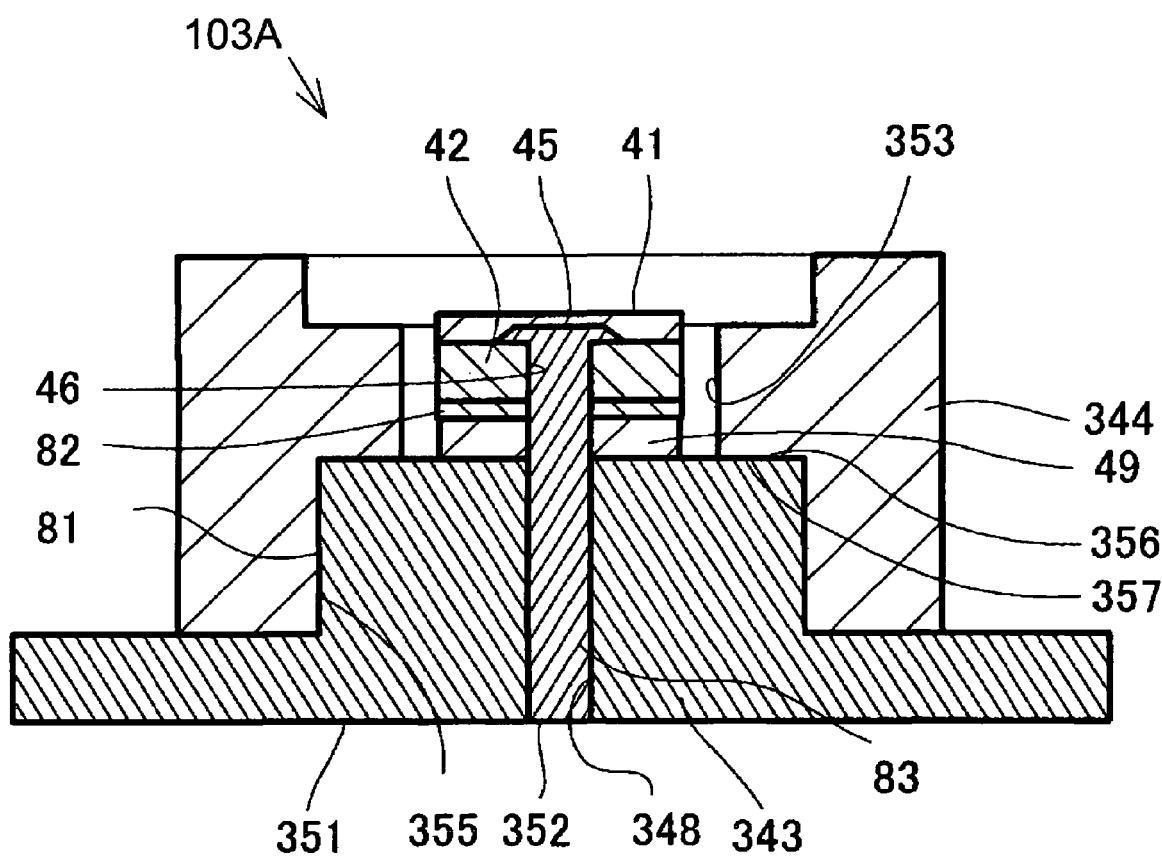
FIG. 23 illustrates another cross-sectional view of the embodiment of FIG. 22.

FIGS. 22 and 23 are cross-sectional views showing a fifth embodiment of a pressure sensor cell 103A according to the present invention. FIGS. 22 and 23 respectively correspond to the cross-sectional views of the pressure sensor cell 103A taken along lines X-X and XI-XI in FIG. 9. In this embodiment, the pressure sensor cell 103A the same as the pressure sensor cell 103 of FIGS. 16 and 17, except that the cell 103A includes a filler 83.

Engine or transmission oil can have a high molecular weight. When the diameter of the through hole 46 of the base member 42 is made as small as feasible, e.g., 0.5 to 1.0 mm, due to the through hole 46 being so small, bubbles can be produced when the through hole 46 is filled with such a high-molecular-weight pressure-transmitting medium. Removing bubbles can be difficult. This problem is prominent in particular when the molecular weight of the pressure-transmitting medium is 200 or greater. The passage is filled with gel, such as silicone or fluorinated gel to completely cover the through hole 46 in the base member 42 from the pressure receiving section 45 of the pressure sensor chip 41, and the joining member 47 at the joint between the base member 42 and the metallic plate member 343. After the gel has been filled, the pressure sensor cell 103 is transferred into a deaerating tank (not shown) and then the tank is evacuated so as to thoroughly deaerate bubbles from the filling material 83, and then the pressure sensor cell 103 is subjected to curing in a constant temperature tank (not shown).

By filling with the gel to also cover the adhesive 82 between the base member 42 and the metallic pipe member 343, the oil resistance can be improved similarly like the protective member 60. Here, not only part of the through hole 348 in the metallic plate member 343 can be filled with the filler 83, the entire through hole 348 can be filled. The extent to which to fill the through hole 348 can be decided as appropriate in accordance with the pressure-transmitting medium to be used in the measurement.

Figure 24:
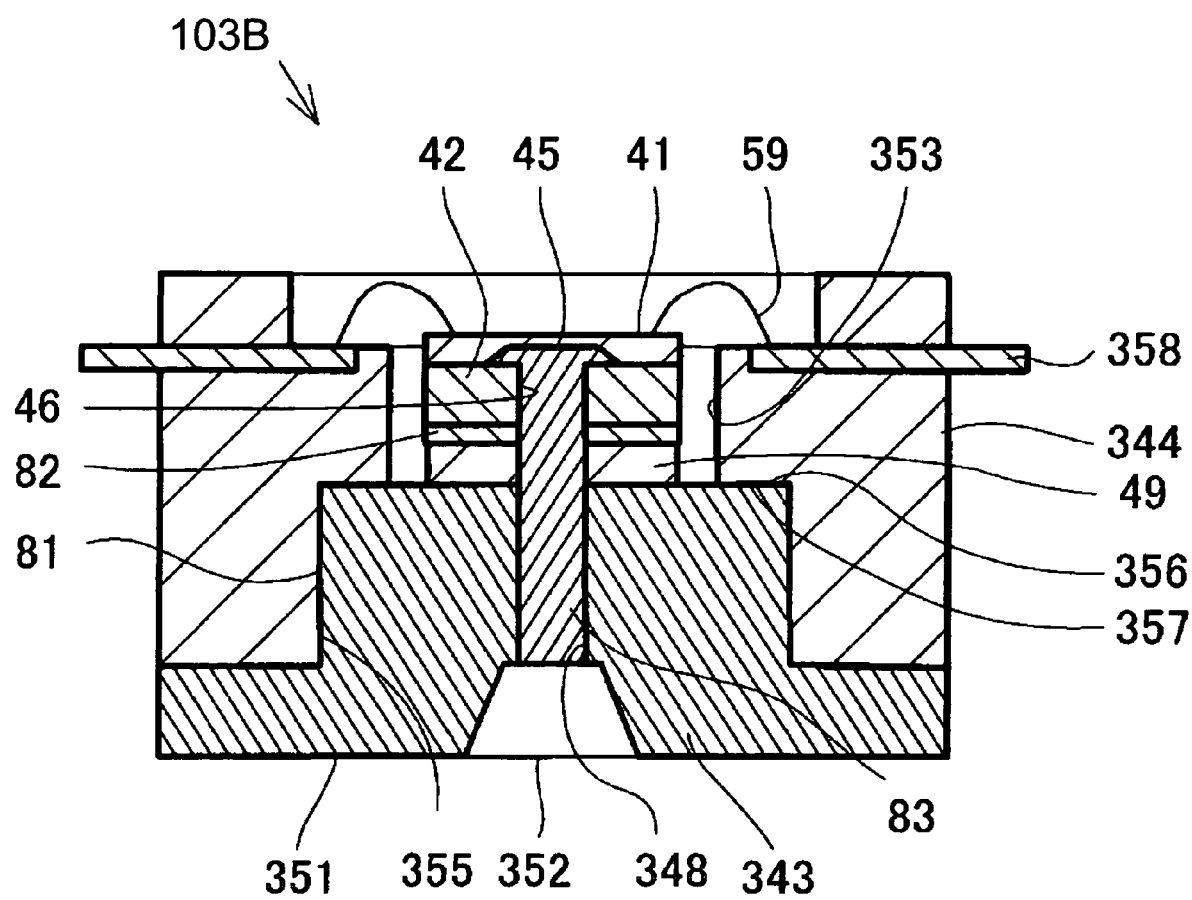
FIG. 24 illustrates a cross section of a sixth embodiment of a pressure sensor cell according to the present invention.
Figure 25:
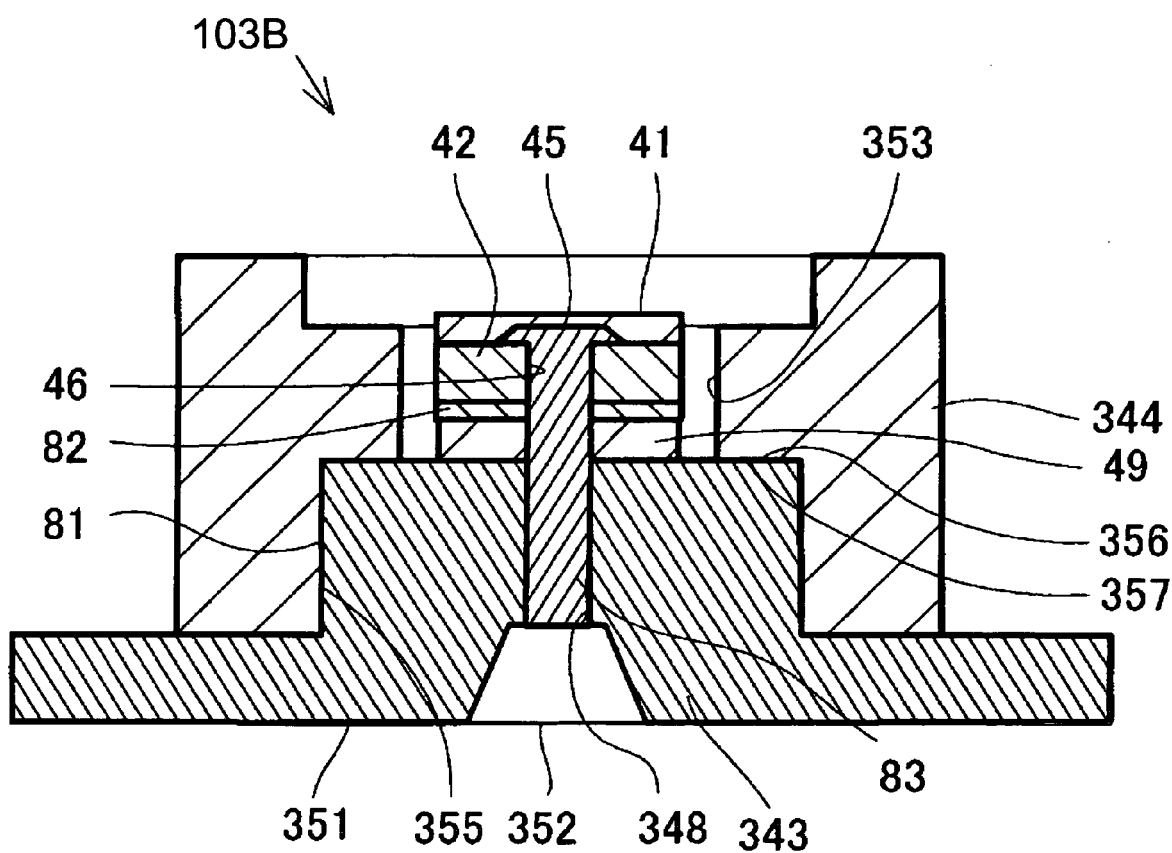
FIG. 25 illustrates another cross-sectional view of the embodiment of FIG. 22.
Figure 26:
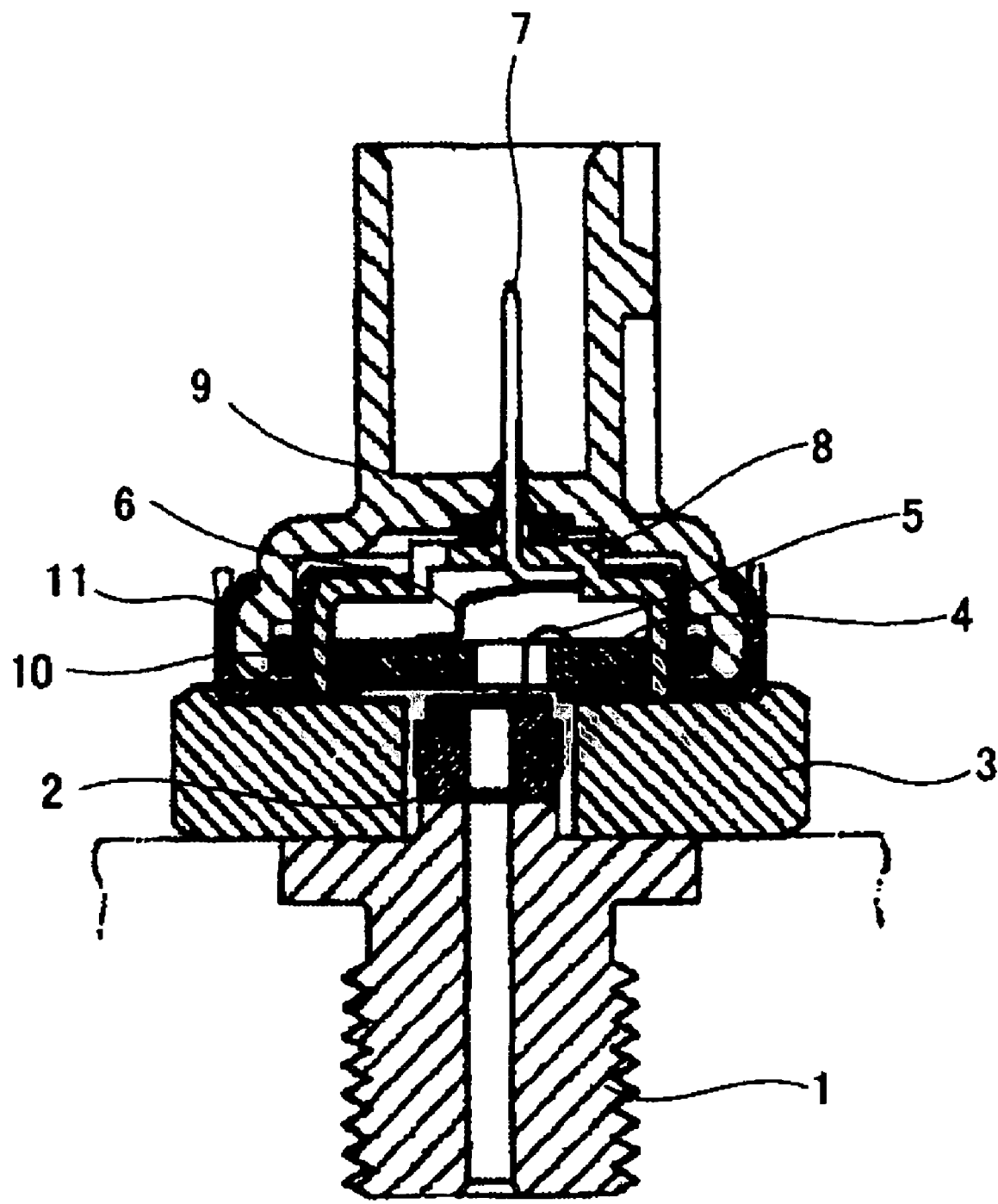
FIG. 26 illustrates a cross section of a conventional pressure sensor device.
Figure 27:
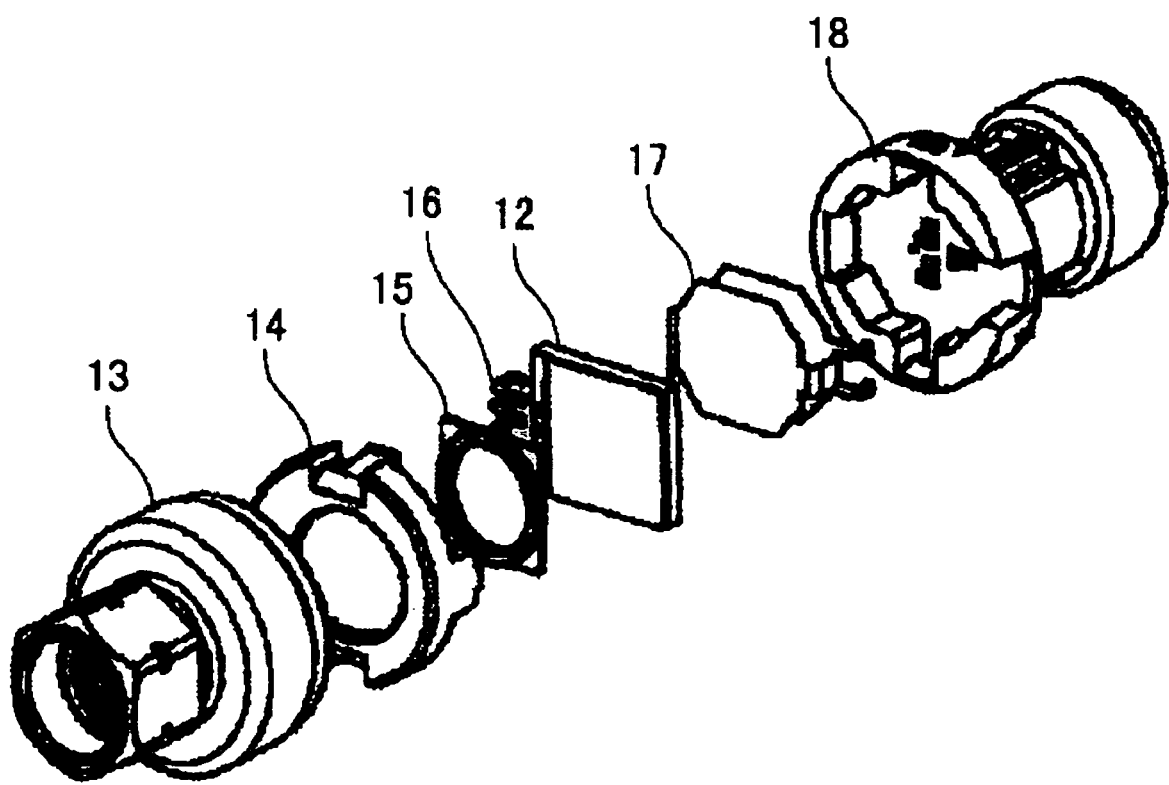
FIG. 27 is an exploded perspective view of another conventional pressure sensor device.
Figure 28:
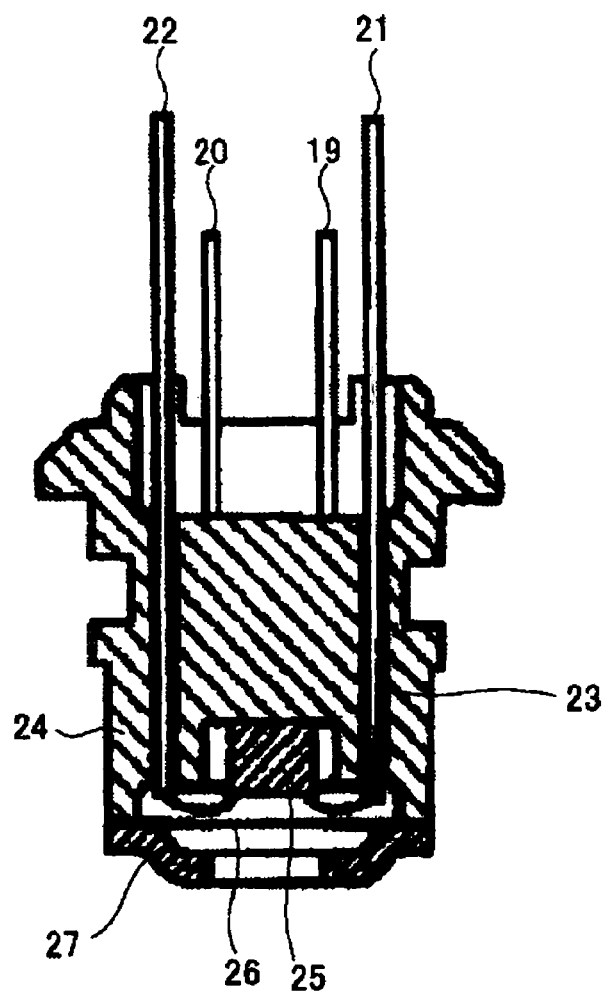
FIG. 28 illustrates a cross section of yet another conventional pressure sensor device.
Figure 29:
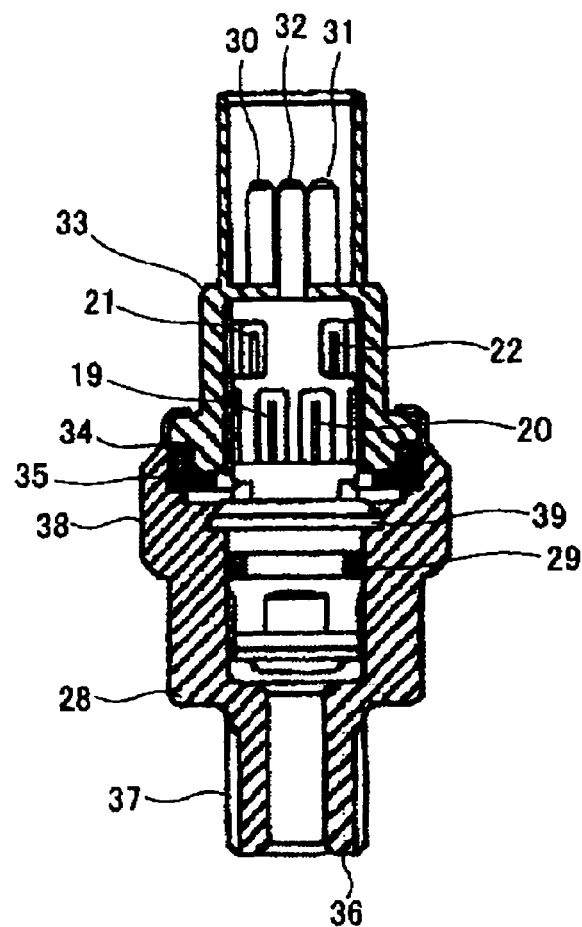
FIG. 29 illustrates a cross section of still yet another conventional pressure sensor device.

FIGS. 24 and 25 are cross-sectional views showing a fifth embodiment of a pressure sensor cell 103B according to the present invention. FIGS. 24 and 25 respectively correspond to the cross-sectional views of the pressure sensor cell 103 taken along lines X-X and XI-XI in FIG. 9. In this embodiment, the pressure sensor cell 103B the same as the pressure sensor cell 103A of FIGS. 22 and 23, except that the cell 103B includes a recess 84 having a diameter larger than that of the through hole 348.

Due to the recess 84 located at the entry of the through hole 348, the pressure-transmitting medium will fill the recess 84 reliably. This can reduce the amount of the filler 83. The recess 84 can have a tapered shape, namely widening toward the pressure introducing port 352 as shown in FIGS. 24 and 25. Alternatively, the tapered shape can widen toward the pressure introducing port 352.

As Examples 1 and 2, in the embodiment of FIGS. 16 and 17, the stress on the adhesive 82 between the base member 42 and the metallic plate member 343 was measured when the pressure sensor cell 103 reached 20 MPa. The base member 42 used was made of PYREX glass, had a height of 1.3 mm, and a 4 mm square, and had a through hole 46 having a diameter of 0.5 mm. The metallic plate member 343 was formed by header working, and had the following dimensions: a=3 mm, b=0.75 mm, c=5 mm, d=12 mm, e=8 mm, diameter of through hole 348=1.2 mm. The base member 42 and the metallic plate member 343 were bonded together using an epoxy adhesive 82. The pressure sensor chip 41 and the base member 42 were joined together by electrostatic bonding. In Example 2, the shape of the metallic plate member changed to that of the flat metallic plate member 243 (see FIGS. 10-11) having the same dimensions as above, except for the thickness being constant at 3 mm, in the pressure sensor cell 103. Moreover, for Examples 1 and 2, the volume of metal in comparison with a metallic plate member having a uniform thickness of 0.75 mm was expressed as the cost ratio (× factor).

| THE TABLE | | |
|---|---|---|
| | Example 1 | Example 2 |
| Epoxy resin von Mises stress (MPa) | 13.86 | 23.94 |
| Metallic plate member volume (= cost ratio × factor) | 2.28 | 4 |

As can be seen from the Table, in comparison with Example 2, the cost of the metallic plate member in Example 1 was reduced by a factor of almost 2, while significantly reducing stress applied to the adhesive.

A pressure sensor device according to the present invention is useful for measuring high pressures above 1 MPa, and in particular is suitable as a pressure sensor device used in any of various devices for automobile use, medical use, industrial use, or household use, etc.

In the embodiments according to the present invention, the output signal from the pressure sensor chip can be output directly to the outside. The signal output from the pressure sensor chip is transmitted to the signal terminal via the wire bonding. This minimizes the number of connections on the signal transmission path to lower the failure probability. Therefore, the long-term reliability of the pressure sensor device can be ensured. Moreover, the smaller number of parts of the pressure sensor cell allows the pressure sensor cell to be obtained at a reduced cost. Therefore, the cost of the pressure sensor device can be reduced.

Moreover, the pressure-transmitting medium can be introduced to the pressure receiving section of the pressure sensor chip. This enables the pressure receiving section to directly receive the pressure of the medium without using silicon oil that largely affects the pressure sensor chip. Therefore, the accuracy and the reliability of the measured signal can be enhanced. Moreover, since the area of the section receiving pressure is limited to the back of the pressure receiving section of the silicon chip, the load applied to the pressure sensor body becomes small. This can downsize the pressure sensor with a simplified structure.

Moreover, as the joining member, namely adhesive, that joins the base member and the pressure introducing means together can be covered with a protective member, drop in the adhesive strength due to oil penetration into the adhesive can be prevented. Similarly, a filler for eliminating bubble problems associated with introducing the pressure-transmitting medium to small pathway to enhance measurement accuracy, can cover and protect the joining member, similar to the protective member.

Moreover, the end of the pressure introducing unit protruding out beyond the resin case can be used as a support for securing another member, such as a connector member, to the pressure introducing unit. As a result, the pressure sensor device is suitable for measuring a high pressure range.

Moreover, the stepped portion of the pressure introducing unit pushed by the pressure of the pressure-transmitting medium against the resin case on the side of the open end of the pressure introducing medium. As a result, high structural reliability under the pressure can be secured. A structure that is relatively fail-safe for high pressure can be realized with a simple arrangement with few parts.

Moreover, stress from the threaded section when the pressure sensor device is screwed onto an oil-filled block or the like can be reduced with a seal, namely an O-ring or the like. Moreover, the pressure sensor device has the output terminal disposed on the side opposite to the opening in the open end of the pressure introducing unit.

Moreover, the joining strength can be improved when the pressure introducing means and the base member are joined together with a metallic material, namely gold/tin eutectic solder or high temperature solder.

Moreover, when the pressure introducing unit is joined to the base member made of glass, chromium has excellent adhesiveness to the glass. When solder, such as gold/tin eutectic solder or high temperature solder, is used to join the pressure introducing unit and the base member together, the surface of the metallic thin film on the solder side can have a gold plating. In this respect, platinum can be provided between the gold and the chromium to prevent the gold and the chromium from coming into contact with one another. Thus, joining strength between the pressure introducing unit and the base member can be increased by providing the metallic thin film having the three-layer structure.

Moreover, as the base member and the pressure introducing unit can be joined together with an adhesive, the part cost can be reduced. Moreover, residual stress after the adhesive joining can be reduced in comparison with joining with a metallic material (solder).

The pressure sensor device according to the invention thus can achieve the following results. Since the number of connections on the signal transmission path to the outside is kept to a minimum, the failure probability is lowered to make it possible to obtain a pressure sensor device with a high long-term reliability. Moreover, a lower cost pressure sensor with a small number of parts can be obtained. Moreover, variation in the output signal due to the influence of silicon oil can be avoided to enhance the accuracy and the reliability of the measured signal. Moreover, due to the presence of a protective film or a filler, the oil resistance also can be improved to enhance the reliability. Moreover, due to the presence of the filler, occurrence of bubbles can be reduced to enhance the accuracy and the reliability of the measured signal. Moreover, when the pressure sensor device is screwed to a block, the stress created in the threaded section applied to the pressure sensor cell can be lessened to enhance the accuracy and reliability of the measured signal. In addition, the pressure sensor device can be obtained in which the output terminal is disposed on the opposite side of the pressure introducing port.

In each of the embodiments, the pressure introducing means can be made of a ceramic, glass, or a resin instead of metal. The material selection can be based on the pressure-transmitting medium and the pressure measurement range. When the pressure introducing unit is made of an insulating material, it can be integrally or monolithically formed with the base member. Moreover, in the embodiment of FIG. 2 and the embodiment of FIG. 6, instead of the O-ring 74 that seals the space between the bottom end of the housing section 63 of the connector member 61 and the bottom face on the inside of the containing section 69 of the joint member 62, an O-ring that seals the space between the outer side face of the housing section 63 of the connector member 61 and the inner side face of the housing section 69 of the joint member 62 can be provided, similar to that of the embodiment of FIGS. 12 and 13. Moreover, the filler 83 or the recess 84 of the fourteenth and fifteenth embodiments also can be incorporated to any other embodiments.

While the present invention has been particularly shown and described with reference to particular embodiments, it will be understood by those skilled in the art that the foregoing and other changes in form and details can be made therein without departing from the spirit and scope of the present invention. All modifications and equivalents attainable by one versed in the art from the present disclosure within the scope and spirit of the present invention are to be included as further embodiments of the present invention. The scope of the present invention accordingly is to be defined as set forth in the appended claims.

This application is based on, and claims priority to, JP PA 2005-084295, filed on 23 Mar. 2005. The disclosure of the priority application, in its entirety, including the drawings, claims, and the specification thereof, is incorporated herein by reference.

What is claimed is:

1. A pressure sensor device comprising:
   a pressure sensor cell comprising:
   a pressure sensor chip having a pressure receiving section for receiving pressure and means for converting strain of the pressure receiving section into an electrical signal;
   a base member having a first face, a second face, and a through hole extending through the first and second faces;
   pressure introducing means having a first face, a second face, and a through hole penetrating through the first and second faces;
   a resin case having a signal terminal for outputting the electrical signal from the pressure sensor chip;
   a joining member joining the pressure introducing means and the base member; and
   at least one of a protective member or a filler,
   wherein the pressure sensor chip is joined to the second face of the base member with the pressure receiving section facing the through hole of the base member,
   wherein the joining member joins the second face of the pressure introducing means to the first face of the base member with the through hole of the pressure introducing means communicating with the through hole of the base member,
   wherein one of the protective member or filler covers the joining member,
   wherein the resin case is bonded to the pressure introducing means with an adhesive, and
   wherein the pressure sensor chip and the signal terminal are electrically connected together by wire bonding.

2. The pressure sensor device according to claim 1, wherein the filler is in the through hole of the base member.

3. The pressure sensor device according to claim 1, wherein the pressure introducing means protrudes beyond an end face of the resin case.

4. The pressure sensor device according to claim 2, wherein the pressure introducing means protrudes beyond an end face of the resin case.

5. The pressure sensor device according to claim 1, wherein the pressure introducing means includes a protruding portion on the second face thereof, and the protruding portion includes a through hole.

6. The pressure sensor device according to claim 2, wherein the pressure introducing means includes a protruding portion on the second face thereof, and the protruding portion includes a through hole.

7. The pressure sensor device according to claim 1, wherein the pressure introducing means has a stepped portion protruding outwardly part way along from an end of the pressure introducing means joined to the base member to an open end of the pressure introducing means at which the through hole opens, and the stepped portion is bonded to the resin case with the stepped portion contacting an end of the resin case on the side of the open end of the pressure introducing means.

8. The pressure sensor device according to claim 2, wherein the pressure introducing means has a stepped portion protruding outwardly part way along from an end of the pressure introducing means joined to the base member to an open end of the pressure introducing means at which the through hole opens, and the stepped portion is bonded to the resin case with the stepped portion contacting an end of the resin case on the side of the open end of the pressure introducing means.

9. The pressure sensor device according to claim 1, wherein the pressure sensor cell further includes a metallic thin film on the first face of the base member, and wherein the joining member, which comprises a metallic material, joins the second face of the pressure introducing means to the first face of the base member.

10. The pressure sensor device according to claim 9, wherein the metallic thin film comprises three layers of chromium or titanium, platinum, and gold.

11. The pressure sensor device according to claim 1, wherein the joining member, which comprises a low-melting glass, joins the second face of the pressure introducing means to the first face of the base member.

12. The pressure sensor device according to claim 1, wherein the joining member, which comprises an adhesive, joins the second face of the pressure introducing means to the first face of the base member.

13. The pressure sensor device according to claim 1, wherein the pressure sensor chip is electrostatically bonded to the base member.

14. The pressure sensor device according to claim 1, wherein the pressure sensor chip is joined to the base member with a low-melting glass.

15. The pressure sensor device according to claim 1, wherein the pressure introducing means is made of 42 alloy and is surface-plated with nickel or nickel and gold.

16. The pressure sensor device according to claim 1, wherein the base member and the pressure introducing means are formed integrally with an insulating material.

17. The pressure sensor device according to claim 1, further including:
   a connector member having a disposing section on which the pressure sensor cell is disposed and an output terminal integrally molded therewith, one end of the output terminal being electrically connected to the signal terminal of the pressure sensor cell and the other end of the output terminal protruding out externally; and
   a joint member comprising a threaded section having a through hole therein, and a containing section having a securing section that secures the connector member, the containing section containing the pressure sensor cell disposed on the connector member,
   wherein the pressure sensor cell is disposed on the connector member with an opening in the first face of the pressure introducing means open for communication with a pressure-transmitting medium,
   wherein the output terminal integrally molded with the connector member is electrically connected to the signal terminal of the pressure sensor cell,
   wherein the through hole of the threaded section communicates with the through hole of the pressure introducing means, and
   wherein a space between the pressure introducing means and the joint member is sealed with sealing means.

18. A pressure sensor device comprising:
   a pressure sensor cell comprising:
   a pressure sensor chip having a pressure receiving section for receiving pressure and means for converting strain of the pressure receiving section into an electrical signal;
   a base member having a first face, a second face, and a through hole extending through the first and second faces;
   pressure introducing means having a first face, a second face, and a through hole penetrating through the first and second faces;

a resin case having a signal terminal for outputting the electrical signal from the pressure sensor chip; and a joining member joining the pressure introducing means and the base member, wherein the pressure sensor chip is joined to the second face of the base member with the pressure receiving section facing the through hole of the base member, wherein the joining member joins the second face of the pressure introducing means to the first face of the base member with the through hole of the pressure introducing means communicating with the through hole of the base member, wherein the resin case is bonded to the pressure introducing means with an adhesive, wherein the pressure introducing means protrudes beyond an end face of the resin case, and wherein the pressure sensor chip and the signal terminal are electrically connected together by wire bonding.

19. The pressure sensor device according to claim 18, further including a protective member that covers the joining member.

20. The pressure sensor device according to claim 18, further including a filler in the through hole of the base member.

21. The pressure sensor device according to claim 18, wherein the pressure sensor cell further includes a metallic thin film on the first face of the base member, and wherein the joining member, which comprises a metallic material, joins the second face of the pressure introducing means to the first face of the base member.

22. The pressure sensor device according to claim 21, wherein the metallic thin film comprises three layers of chromium or titanium, platinum, and gold.

23. The pressure sensor device according to claim 18, wherein the joining member, which comprises a low-melting glass, joins the second face of the pressure introducing means to the first face of the base member.

24. The pressure sensor device according to claim 18, wherein the joining member, which comprises an adhesive, joins the second face of the pressure introducing means to the first face of the base member.

25. The pressure sensor device according to claim 18, wherein the pressure sensor chip is electrostatically bonded to the base member.

26. The pressure sensor device according to claim 18, wherein the pressure sensor chip is joined to the base member with a low-melting glass.

27. The pressure sensor device according to claim 18, wherein the pressure introducing means is made of 42 alloy and is surface-plated with nickel or nickel and gold.

28. The pressure sensor device according to claim 18, wherein the base member and the pressure introducing means are formed integrally with an insulating material.

29. The pressure sensor device according to claim 18, further including:

a connector member having a disposing section on which the pressure sensor cell is disposed and an output terminal integrally molded therewith, one end of the output terminal being electrically connected to the signal terminal of the pressure sensor cell and the other end of the output terminal protruding out externally; and a joint member comprising a threaded section having a through hole therein, and a containing section having a securing section that secures the connector member, the containing section containing the pressure sensor cell disposed on the connector member, wherein the pressure sensor cell is disposed on the connector member with an opening in the first face of the pressure introducing means open for communication with a pressure-transmitting medium, wherein the output terminal integrally molded with the connector member is electrically connected to the signal terminal of the pressure sensor cell, wherein the through hole of the threaded section communicates with the through hole of the pressure introducing means, and wherein a space between the pressure introducing means and the joint member is sealed with sealing means.

* * * * *